United States Patent [19]
Iwama

[11] Patent Number: 5,887,602
[45] Date of Patent: Mar. 30, 1999

[54] CLEANING MACHINE AND METHOD OF CONTROLLING THE SAME

[75] Inventor: Tatsuyuki Iwama, Tosu, Japan

[73] Assignee: Tokyo Electron Limited, Tokyo, Japan

[21] Appl. No.: 686,146

[22] Filed: Jul. 24, 1996

[30] Foreign Application Priority Data

Jul. 31, 1995 [JP] Japan .................................. 7-214118
Jul. 31, 1995 [JP] Japan .................................. 7-214119
Jul. 31, 1995 [JP] Japan .................................. 7-214120

[51] Int. Cl.$^6$ ............................ A45B 25/08; A45B 25/28; A61H 3/02
[52] U.S. Cl. .............................. 134/43; 134/48; 134/68; 134/58 D
[58] Field of Search ................. 134/43, 48, 68, 134/58 D

[56] References Cited

U.S. PATENT DOCUMENTS 4,561,904 12/1985 Eberhardt, Jr. ........................ 134/18
5,357,648 10/1994 Noestheden ........................... 15/302

*Primary Examiner*—Kriellion S. Morgan
*Attorney, Agent, or Firm*—Oblon, Spivak, McClelland, Maier & Neustadt, P.C.

[57] ABSTRACT

A cleaning machine comprises a loader section for transferring a to-be-processed object, an unloader section for transferring a processed object, a chemical liquid bath for cleaning the to-be-processed object with chemical liquid, a plurality of cleaning units, sequentially arrayed at a lower stream of the chemical liquid bath in a direction from the loader section to the unloader section, having a water cleaning bath for cleaning the to-be-processed object with pure water, a plurality of transfer machines for transferring the to-be-processed object between the loader section and the cleaning unit adjacent to the loader section, between the adjacent cleaning units, and between the unloader section and the cleaning unit adjacent to the unloader section, sequentially, a plurality of sensors, provided in the chemical liquid bath and the cleaning units, for detecting a chemical liquid state and a cleaning operation state, and control means for executing a process for measurement against abnormality in response to each of signals from the sensors.

9 Claims, 19 Drawing Sheets

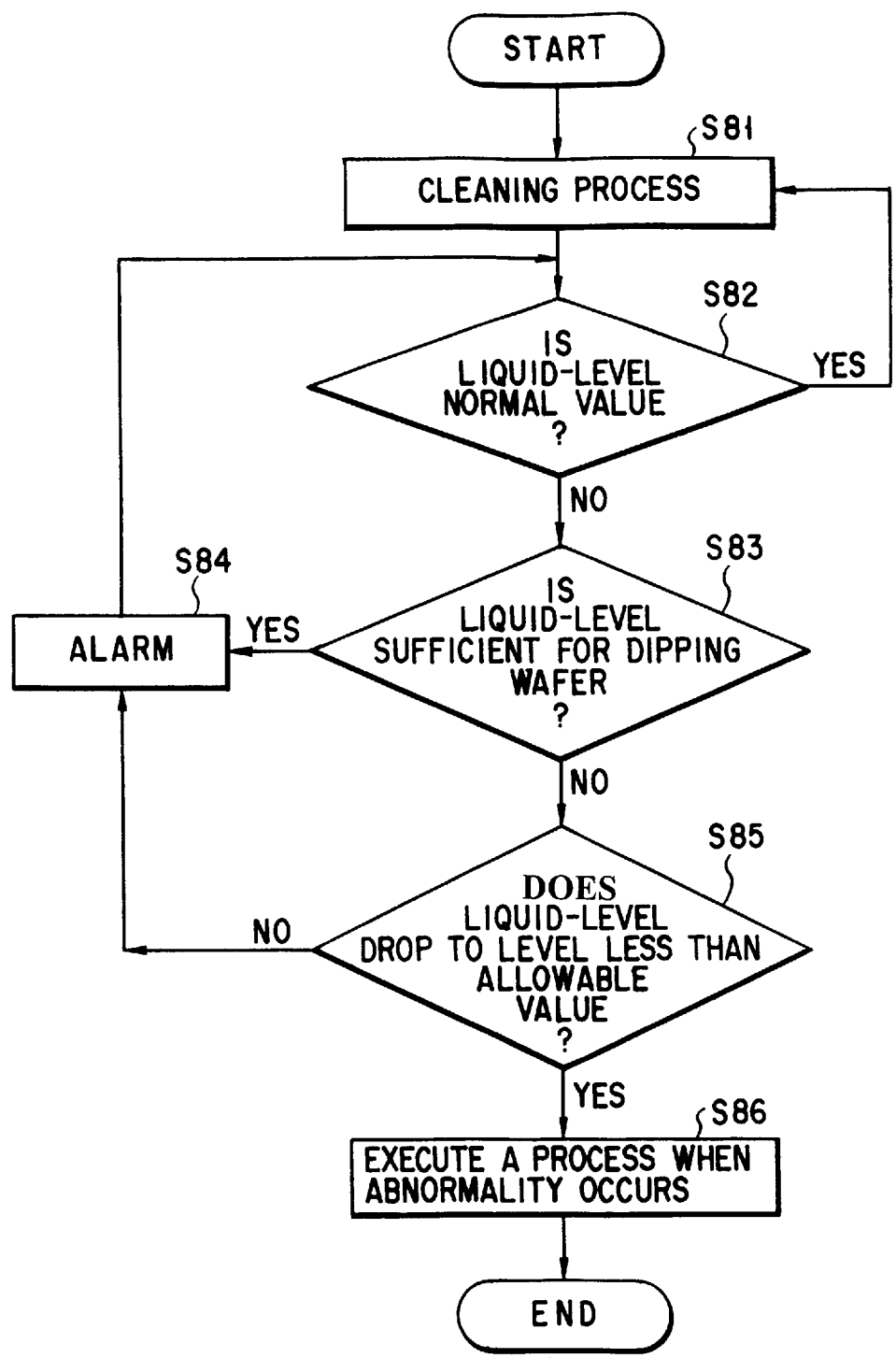
F I G. 12

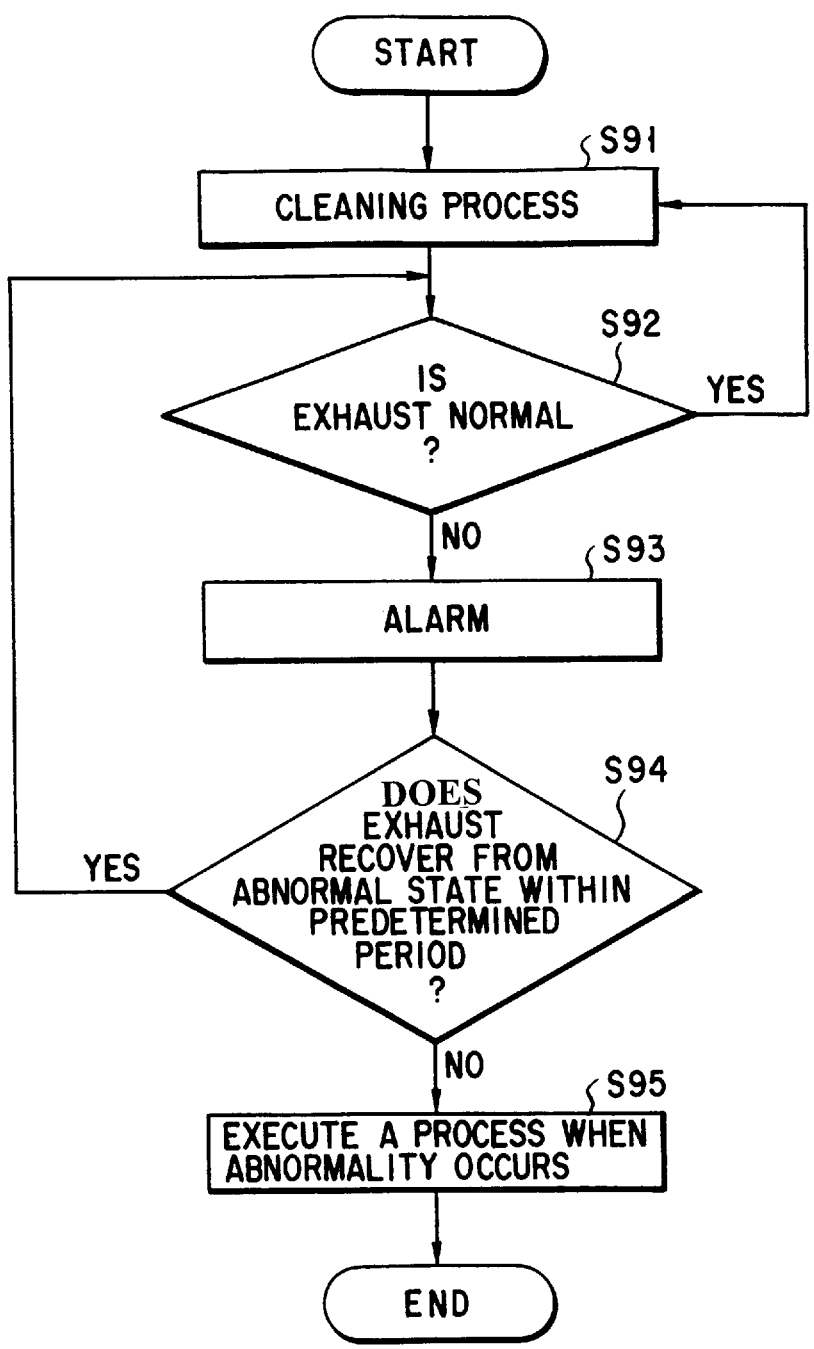
F I G. 13

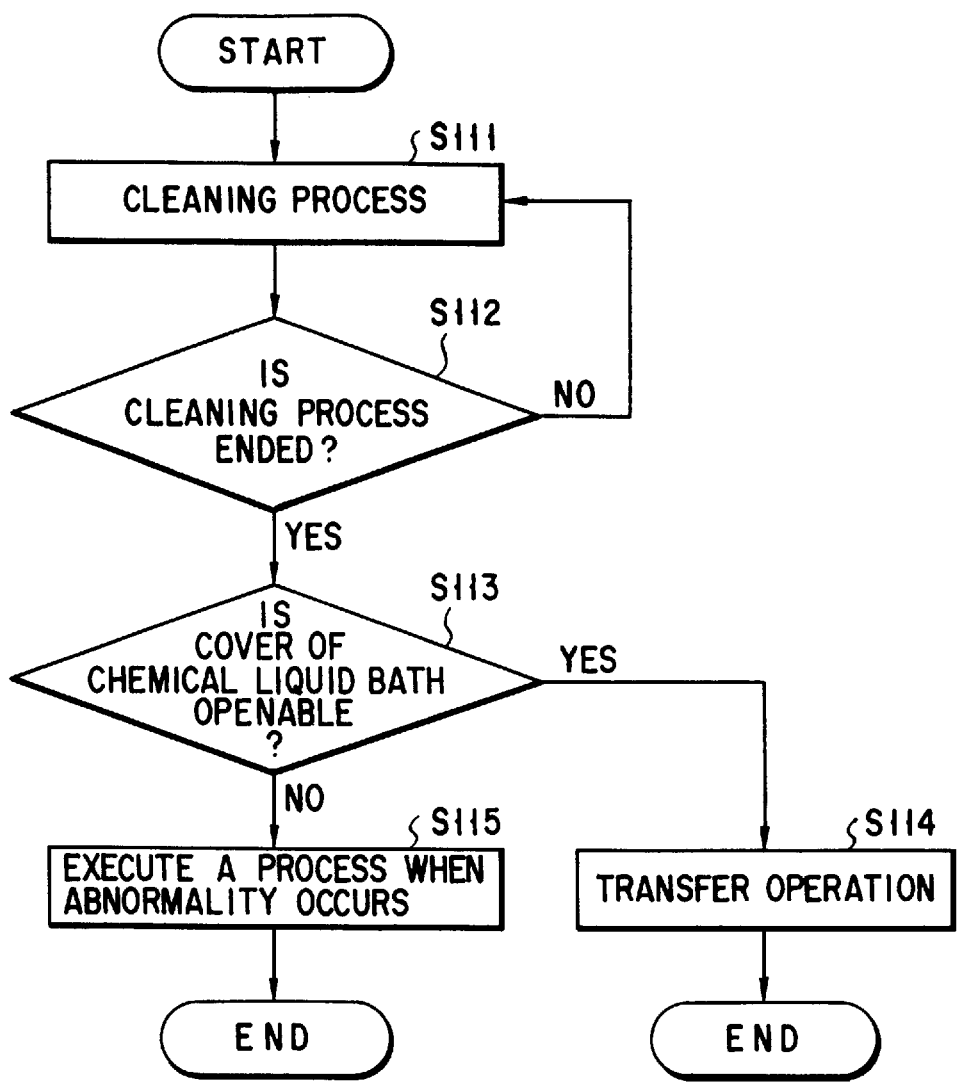
F I G. 15

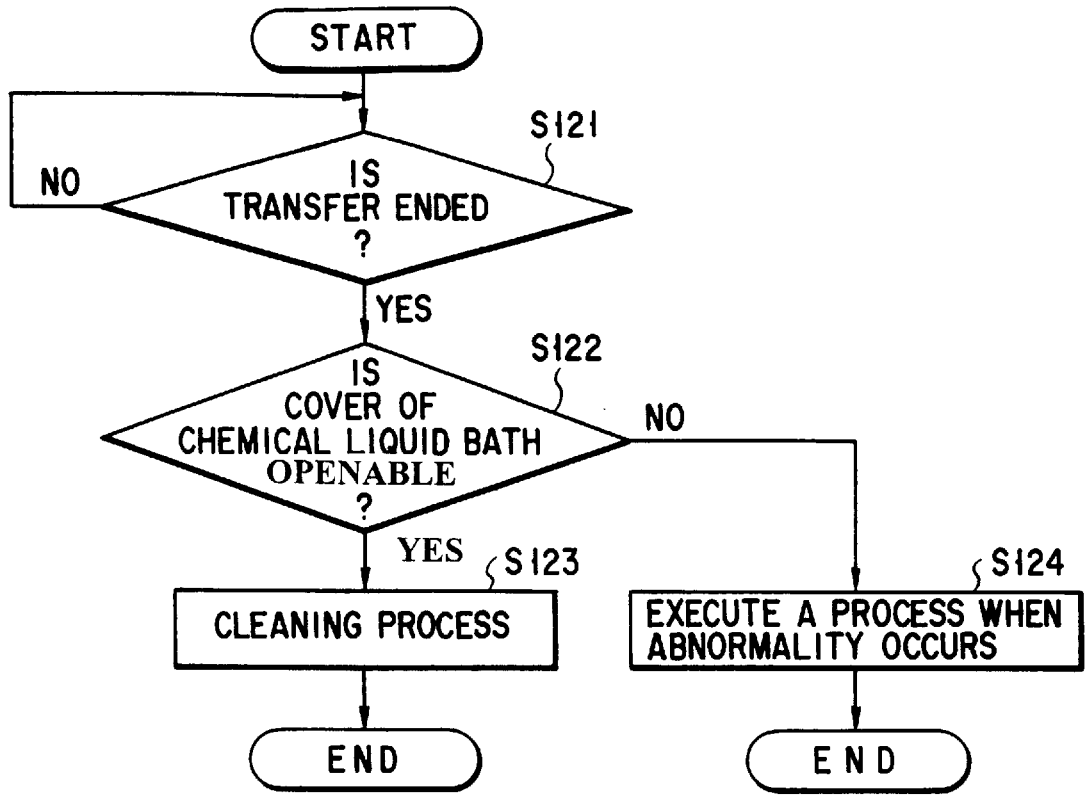
F I G. 16
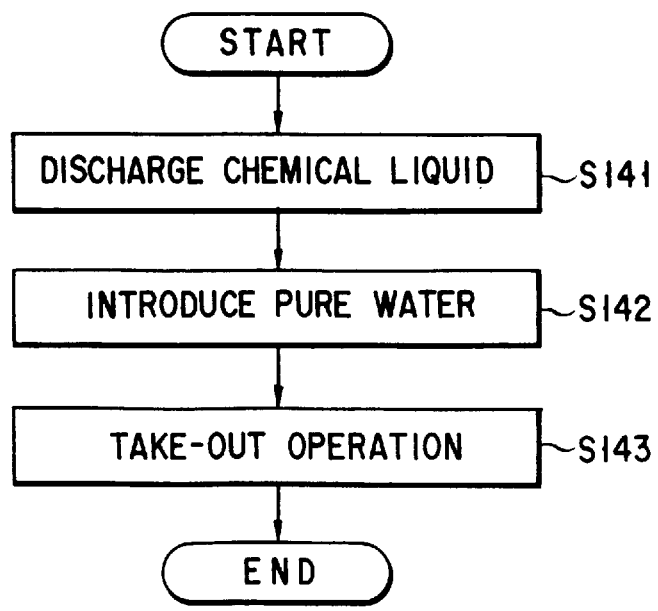
F I G. 18

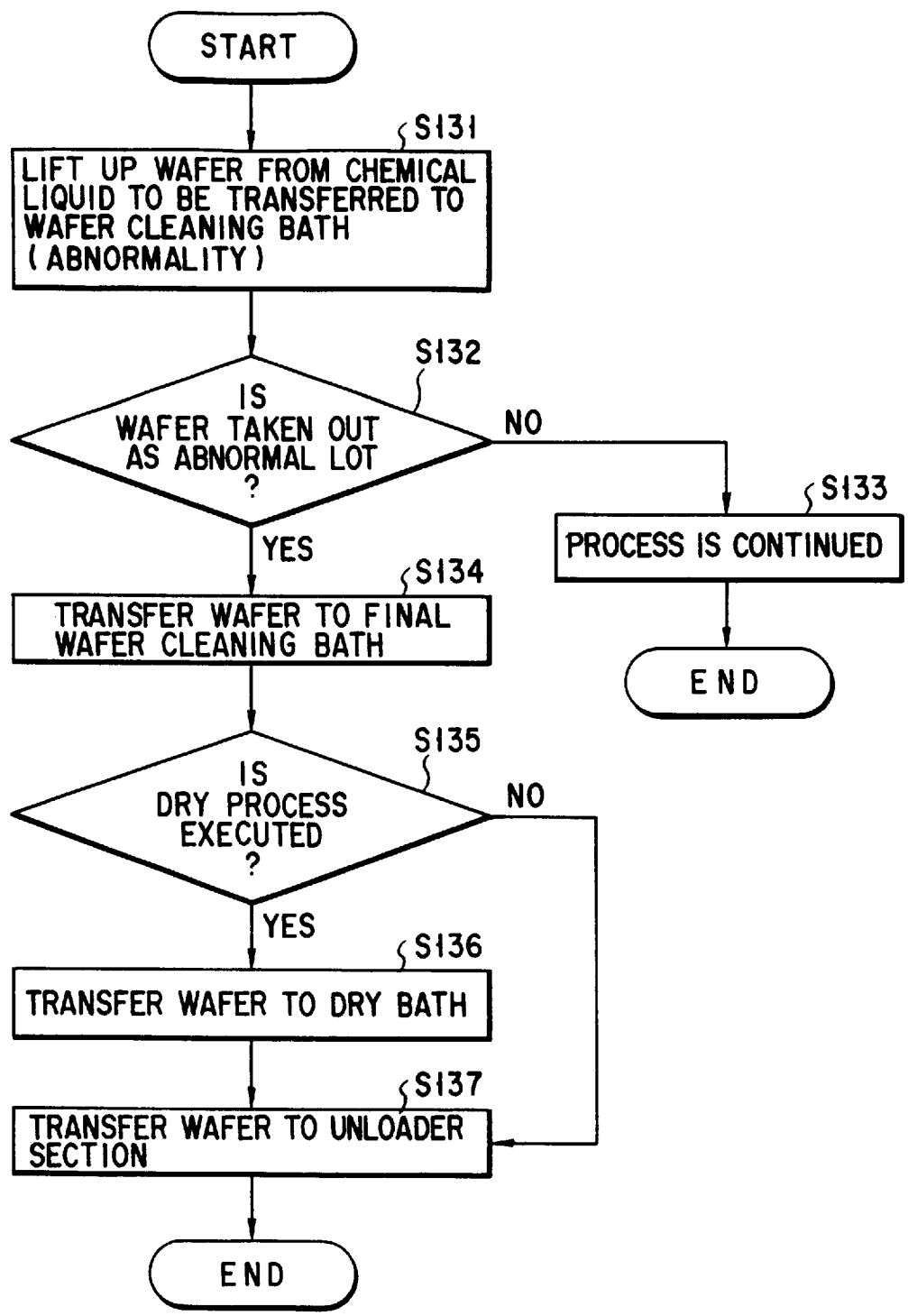
F I G. 17

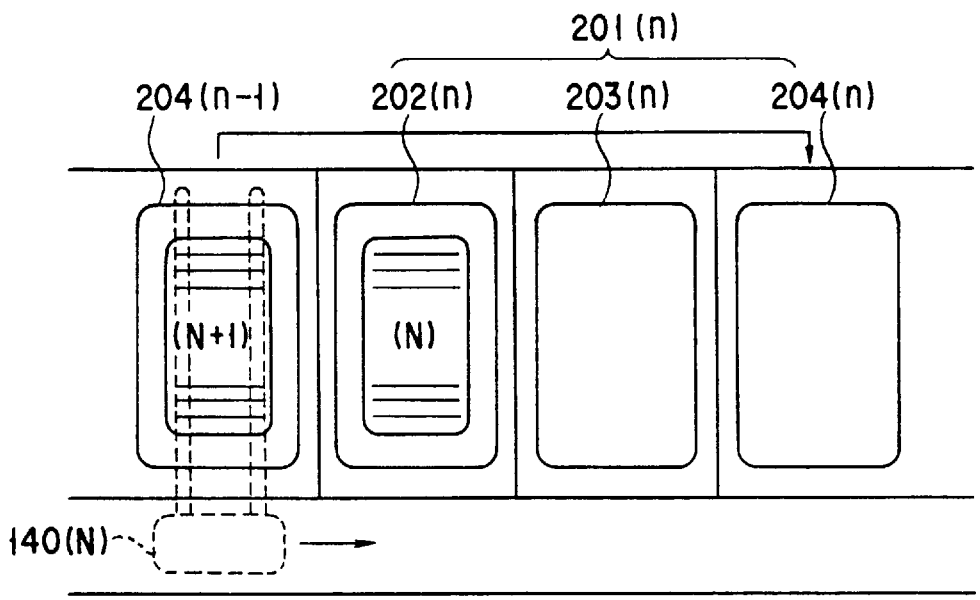
F I G. 19
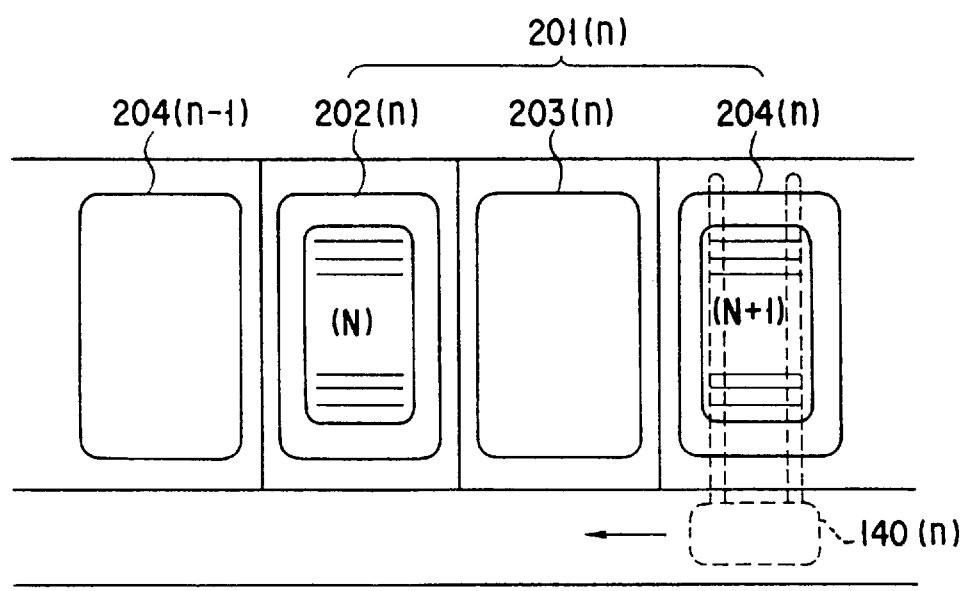
F I G. 20

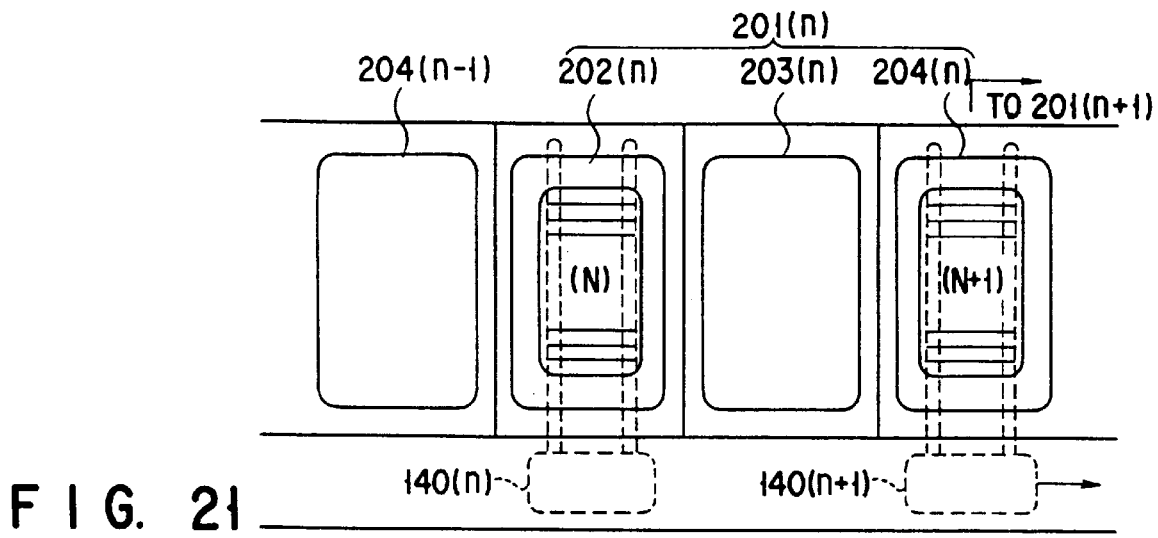
F I G. 21
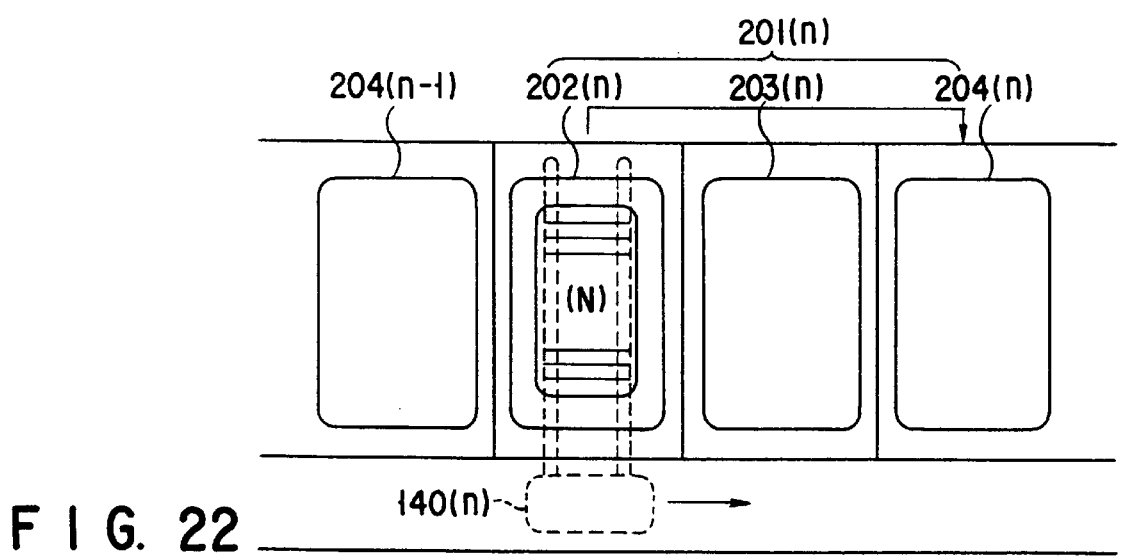
F I G. 22
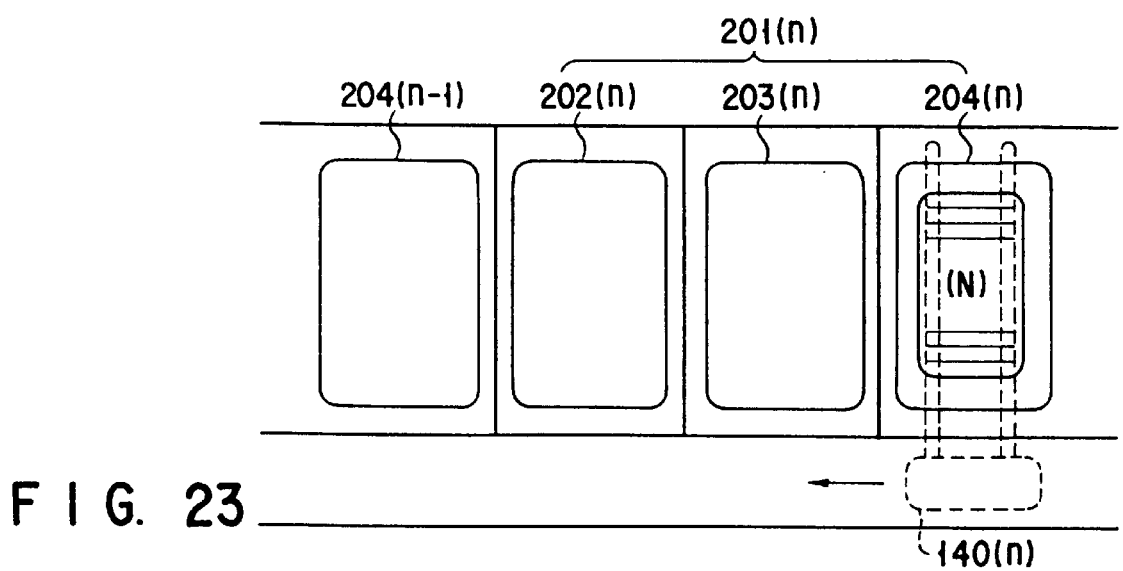
F I G. 23

CLEANING MACHINE AND METHOD OF CONTROLLING THE SAME

BACKGROUND OF THE INVENTION

1. Field of the Invention

The present invention relates to a cleaning machine for cleaning objects such as semiconductor wafers and a method of controlling the same.

2. Description of the Related Art

In a cleaning process of the manufacturing steps of a semiconductor device such as LSI, a cleaning machine has been conventionally used to remove contaminations such as particles formed on a semiconductor wafer, organic contaminants, metallic impurities. Particularly, a wet-type cleaning machine has been widely used since particles can be effectively removed and a batch process can be carried out.

In the wet-type cleaning machine discussed above, a containing member, which is called a carrier, containing a predetermined number of semiconductor wafers, e.g., 25 semiconductor wafers, is loaded on a loader of the cleaning machine by a transfer robot. After an orientation flat alignment is carried out and the contained semiconductor wafers are lifted up from the carrier by a holding unit so that the lifted-up semiconductor wafers are set to a transfer standby state. The semiconductor wafers in the transfer standby state are transferred to a cleaning section where various kinds of cleaning processes are carried out by a transfer machine having a chucking unit, which is called a wafer chuck. Then, in the cleaning section, a predetermined cleaning process is provided to the semiconductor wafers.

The cleaning section comprises one or more cleaning units, which are sequentially arranged to carry out various kinds of chemical cleaning such as SC1 cleaning, S2 cleaning, HF cleaning, and SPM cleaning. Each of the cleaning units comprises a chemical liquid cleaning bath for chemical liquid cleaning and a water cleaning bath for pure (deionized) water cleaning. Processing objects transferred by the transfer machine are cleaned with chemical liquid in the chemical liquid cleaning bath to be supplied to the water cleaning bath provided at a lower stream of the chemical cleaning bath. In the water cleaning bath, chemical liquid adhered onto a surface of each of the semiconductor wafers is washed off with pure water so as to be transferred to a cleaning unit using a different kind of chemical liquid. In this way, a series of cleaning processes is ended, and the wafers are finally cleaned with pure water. Then, the finally cleaned wafers are dried, and transferred to an outer section of the cleaning machine through an unloader section.

In the chemical liquid cleaning bath of the above-mentioned cleaning machine, there are generally used chemical liquids having high temperature and high reactivity such as APM (mixture of aqueous ammonia and hydrogen peroxide), HPM (mixture of hydrochloric acid and hydrogen peroxide), HF (hydrofluoric aqua) or SPM (sulfuric acid). Due to this, there is the possibility that a lot of wafers to be processed will be damaged or that the cleaning machine itself may be in a dangerous state in some cases, e.g., abnormality of chemical liquid itself such as abnormality of temperature or that of an amount of chemical liquid, trouble with the chemical liquid cleaning bath itself, for example, abnormality of the chemical liquid circulating system, that of an exhaust system, or that of an opening/closing mechanism of a cover.

Therefore, regarding the trouble of the chemical liquid cleaning bath, it is important for the cleaning machine itself to be controlled to be automatically avoid the worst state based on a fail-safe concept. Due to this, development of the cleaning machine and its control system has been strongly desired.

In the chemical liquid cleaning bath, there is possibility that various kinds of trouble will be generated at the time of the cleaning process. For example, if the temperature of chemical liquid is too low, processing objects cannot be sufficiently cleaned. If the temperature of chemical liquid is too high, there is the possibility that damage is exerted onto normal portions excepting the portion where contaminants are adhered. Also, if chemical liquid is not sufficiently supplied to the chemical liquid cleaning bath, there is possibility that damage will be exerted on a wafer portion exposed to air in addition to the point that the wafers are cannot be sufficiently cleaned. Furthermore, if the amount of chemical liquid in the chemical liquid cleaning bath is too large, there is possibility that the structural parts of the chemical liquid cleaning bath will be damaged or contaminated. In the cleaning machine, an exhaust mechanism is provided to exhaust vaporized chemical liquid. However, if trouble occurs in such an exhaust mechanism, there is possibility that vaporized chemical liquid will not be sufficiently exhausted so that the structural parts of the chemical liquid cleaning bath will be damaged or contaminated. Or, even in a case where abnormality occurs in the chemical circulating system, the wafers cannot be sufficiently cleaned. On the chemical liquid cleaning bath, a cover is provided. The cover is opened when the wafers are place in or taken out of the bath, and closed when the wafers are neither taken in nor placed out. Thereby, chemical liquid can be prevented from being diffused from the chemical liquid cleaning bath. Also, contaminants can be prevented from being introduced to the chemical liquid cleaning bath from the outer section. However, if trouble occurs in the opening/closing mechanism of the cover, there is the possibility that the wafers of the chemical liquid cleaning baths will be taken out and that the wafers will be damaged.

SUMMARY OF THE INVENTION

An object of the present invention is to provide a cleaning machine, which can correctly ascertion a state of chemical liquid of the machine so as to automatically take measures against an abnormal state, and a method of controlling the same.

According to a first aspect of the present invention, there is provided a cleaning machine comprising a loader/unloader section for transferring a processing object and/or a processed object; a chemical liquid bath section having one or more chemical liquid baths for cleaning the processing object with chemical liquid, one or more cleaning units, sequentially following the chemical liquid bath and having one or more water cleaning baths for cleaning the processing object with pure water; one or more transfer machines for transferring the processing object between the loader/unloader section and the cleaning unit; a plurality of sensors, provided in the chemical liquid bath and the cleaning units, for detecting a chemical liquid state and a cleaning operation state; and a control section for executing a process for measurement against abnormality in response to each of the signals from the sensors.

According to a second aspect of the present invention, there is provided a cleaning method comprising the steps of cleaning a processing object transferred by a loader/unloader section with chemical liquid in a chemical liquid bath; transferring the processing object cleaned with chemical liquid in the chemical liquid bath to a water cleaning bath following the chemical liquid bath; cleaning the processing object, cleaned with the chemical liquid, with pure water in the water cleaning bath; detecting a chemical liquid state and a cleaning operation state by a plurality of sensors; and providing a process for measurement against abnormality to the processing object in response to an abnormal detection signal sent from each of the sensors.

According to a third aspect of the present invention, there is provided a cleaning machine comprising a loader/unloader section for transferring a to-be-processed object and/or a processed object; at least one cleaning unit having a plurality of process baths for cleaning the processing object; at least one transfer machine for transferring the processing object to the process baths; and a transfer control section for controlling the processing object to jump over at least one process bath so as to be transferred to a predetermined process bath.

According to a fourth aspect of the present invention, there is provided a cleaning machine comprising a loader/unloader section for transferring a to-be-processed and/or a processed object; a chemical liquid bath section having one or more chemical liquid baths for cleaning the processing object with chemical liquid; one or more cleaning units having one or more water cleaning baths for cleaning the processing object with pure water; one or more transfer machines for transferring the to-be-processed object to the cleaning unit and the loader/unloader section; a waste liquid discharging section for discharging chemical liquid of the chemical liquid bath; a position detecting section for detecting that the processing object has arrived at a predetermined position of an upper stream of the chemical liquid bath after discharging the chemical liquid; and a section for introducing chemical liquid to the chemical liquid bath in response to the position detection obtained by the position detecting section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

Brief Description of the Drawings

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 12 is a flow chart showing a process flow when abnormality of a liquid surface is generated;

FIG. 13 is a flow chart showing a process flow when abnormality of an exhaust system is generated;

FIG. 15 is a flow chart showing a process flow when abnormality is generated in an opening/closing mechanism of a cover of the chemical liquid cleaning bath;

FIG. 16 is a flow chart showing a process flow when abnormality is generated in an opening/closing mechanism of a cover of the chemical liquid cleaning bath;

FIG. 17 is a flow chart showing a process flow of an auto take-out operation;

FIG. 18 is a flow chart showing a process flow of an automatic chemical liquid/pure water replacement drive;

FIG. 19 is a plane view of a cleaning unit to explain a jump mode operation;

FIG. 20 is a plane view of a cleaning unit to explain a jump mode operation;

FIG. 21 is a plane view of a cleaning unit to explain a jump mode operation;

FIG. 22 is a plane view of a cleaning unit to explain a jump mode operation;

FIG. 23 is a plane view of a cleaning unit to explain a jump mode operation;

Detailed Description of the Preferred Embodiment

An embodiment of the present invention will be explained with reference to drawings.

Figure 1:
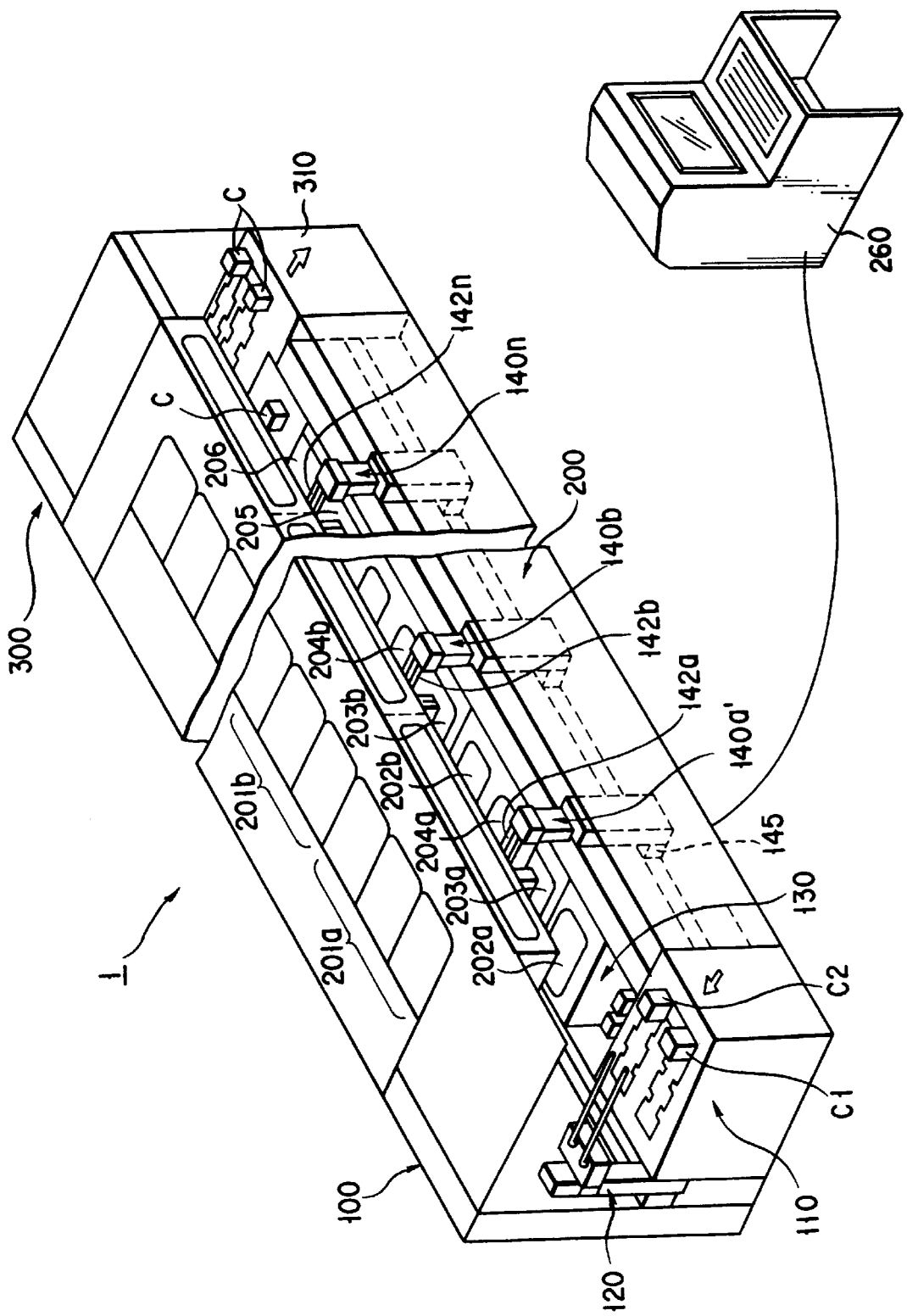
FIG. 1 is a schematic perspective view showing a cleaning machine of an embodiment of the present invention.

As shown in FIG. 1, a cleaning machine 1 comprises three sections, that is, a loader section 100, a cleaning section 200, and an unloader section 300. The loader section 100 contains to-be-processed objects, which are still unprocessed, for example, semiconductor wafers on a carrier unit. The cleaning section 200 is used to clean the wafers, and the unloader section 300 is used to take out the cleaned wafers to the outside of the cleaning machine by a carrier unit.

Figure 2:
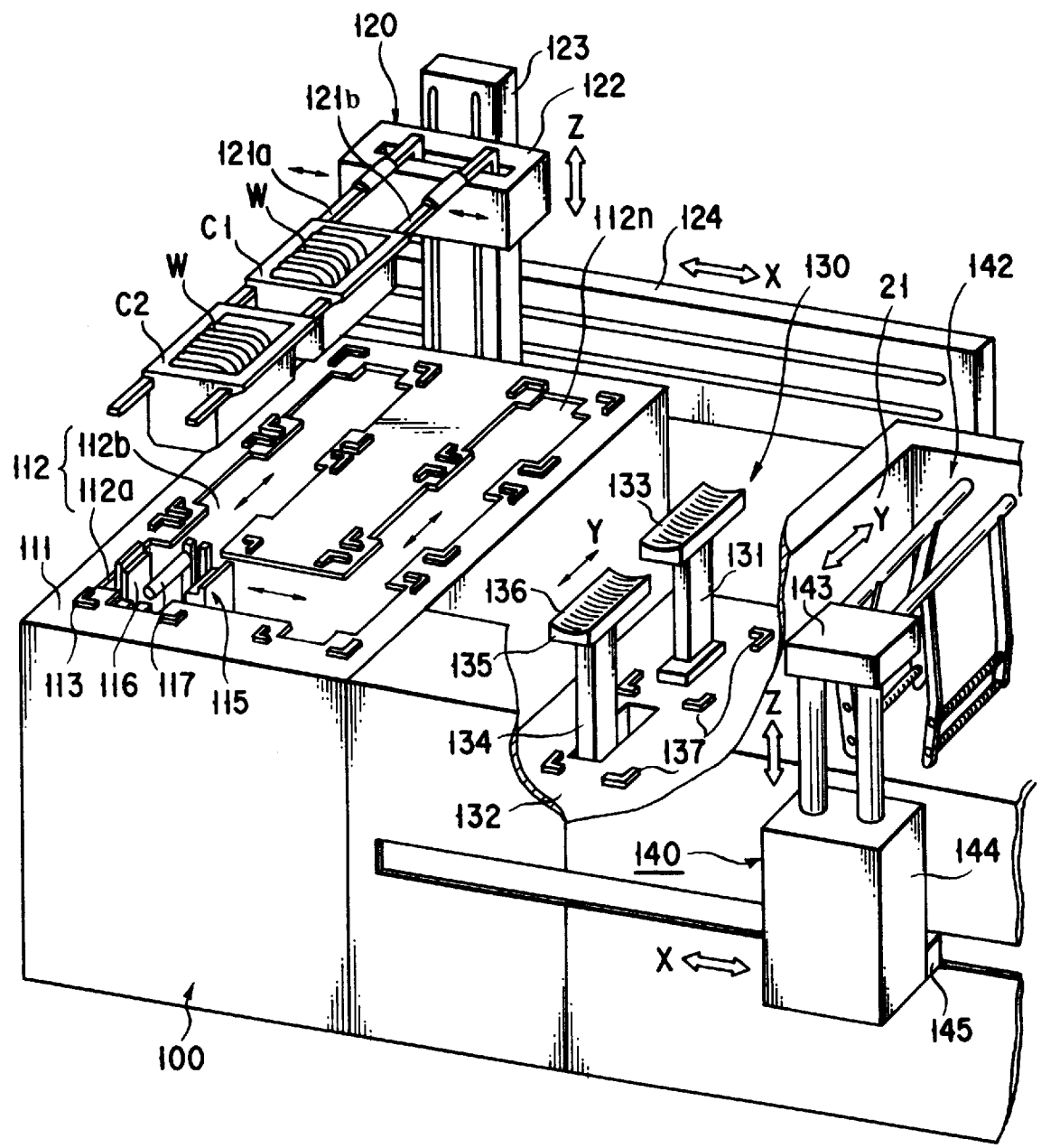
FIG. 2 is an expanded perspective view of the loader section of the cleaning machine of FIG. 1.

The loader section 100 comprises a platform 110, a conveyer machine 120, and a relay section 130. The platform 110 carries in a carrier C, which contains a predetermined number of unclean wafers, for example, 25 unclean wafers to be mounted thereon. The conveyer machine 120 conveys the mounted carrier C to holding units 133 and 135 as shown in an expanded view of FIG. 2. The relay section 130 is used to lift up the wafers from the carrier C so as to be delivered to a wafer transfer mechanism 140. As shown in FIG. 2, the platform 110 comprises a hollow base 111. On a surface of the base 111, there are aligned two columns of stations 112a, 112b, ..., 112n each having an opening through which a lower portion of the carrier C is insertable.

An engaging section 113 for engaging an upper edge corner portion of the carrier C is formed at each of the corner portions of the respective stations 112.

The loader 100 further comprises a moving mechanism 115. The moving mechanism 115 can be freely driven in upper and lower directions and a horizontal direction by a driving mechanism (not shown). The moving mechanism 115 can move the carrier C clamped by a clamp member 116 to each of predetermined stations 112a, 112b, ..., 112n. The moving mechanism 115 comprises an alignment unit 117 for aligning each of the orientation flats of wafers W contained in the carrier C. An orientation flat alignment of wafers W is carried out when the carrier C is moved.

As shown in FIG. 2, the conveyer machine 120 is positioned at the back of the loader 100. The conveyer machine 120 comprises a pair of arms 121a, 121b, a lifter 122, a Z base 123, and an X base 124. The arms 121a, 121b are freely approached each other and separated from each other. The lifter 122 supports these arms 121a and 121b. The Z base 123 moves the lifter in upper and lower directions (Z direction). The X base 124 moves the base 123 itself in a longitudinal direction of the cleaning machine. An outer surface of the carrier C is sandwiched by the arms 121a and 121b in a state that both peripheral edges of the carrier C are mounted on the arms 121a and 121b. Thereby, the conveyer machine 120 can convey the carrier C to the relay section 130 of FIG. 1.

The relay section 130 has holder 133 and 135. The holder 133 is fixed onto an upper plate 132 by a post 131. The holder 135 is supported by a moving post 134, which is movable to the upper plate 132 in the direction Y. These holders 133 and 135 are shaped to be freely passed through the opening portion of the carrier C. Moreover, there are formed a predetermined arcuate holding notches, for example, 25 holding notches, which correspond to the number of wafers contained in the carrier C. Four engaging members 137 are provided on the upper plate 132 close to the base portion of each of the posts 131 and 134. The corners of the lower end portion of the carrier C are engaged with the engaging members 137, respectively.

Figure 3:
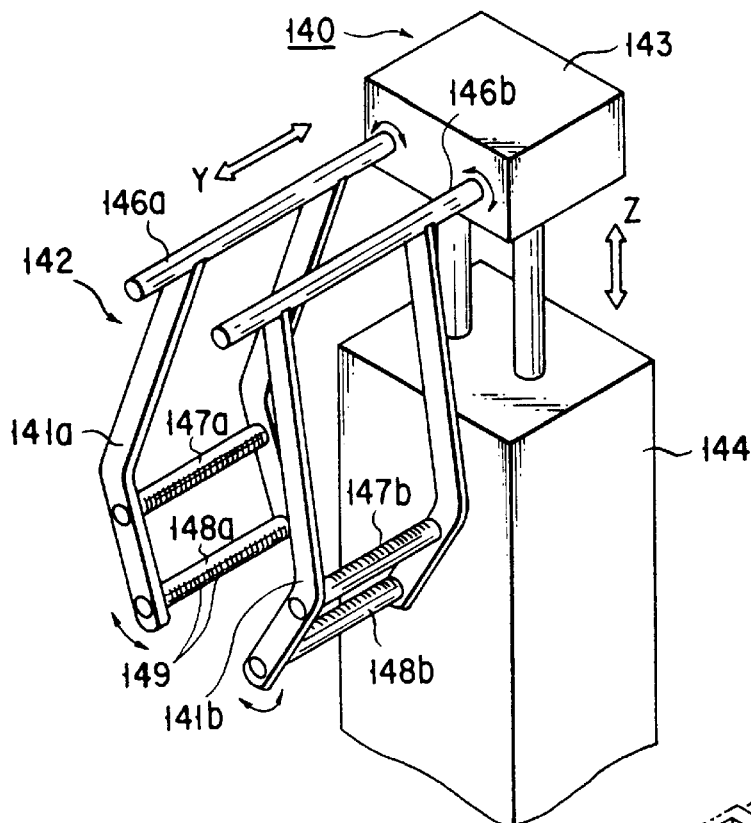
FIG. 3 is an expanded perspective view of a wafer transfer machine of the cleaning machine of FIG. 1.

A wafer transfer mechanism 140 is used to hold wafers held by the holders 133 and 135 in the lump to be transferred to the cleaning section 200. More specifically, the wafer transfer mechanism 140 is structured as shown in FIG. 3. The wafer transfer mechanism 140 comprises a wafer chuck 142, a holder 143, a driving mechanism 144, and a transfer base 145 (see FIG. 2). The wafer chuck 142 has a pair of right and left chuck members 141a and 141b for holding, e.g., 50 wafers in the lump. The holder 143 has an opening and closing mechanism for holding the wafer chuck 142 and a mechanism for moving the wafer chuck 142 in the forward and backward directions (that is, the Y direction). The driving mechanism 144 moves the holder 143 in the upper and lower directions (that is, the Z direction). The transfer base 145 moves the driving mechanism 144 along the longitudinal direction (X direction) of the cleaning section 200.

The right and left chuck members 141a and 141b of the wafer chuck 142 are symmetrically formed. Rotating shafts 146a and 146b are supported to be freely rotatable by the holder 143. Thereby, the chuck members 141a and 141b are freely opened and closed. The upper ends of the chuck members 141a and 141b, which are made of quartz, are fixed to the rotating shafts 146a and 146b, respectively. Moreover, holding bars 147a, 147b, 148a, and 148b are made of quartz. These holding bars are formed at upper and lower stages between the lower end portions of the chuck members 141a and 141b to be parallel to each other. On the corresponding surfaces of the holding bars 147a, 147b, 148a, 148b, there are formed, for example, 50 holding notches to which peripheral edges of wafers W are inserted. The rotating shafts 146a and 146b are rotated, so that wafers W are held by the holding bars 147a, 147b, 148b, and 148b. Thereby, wafers W are transferred to a predetermined position in the upper and lower directions (Z direction), and the longitudinal direction (X direction).

The wafer transfer mechanism 140 is provided to transfer wafers between cleaning units 201a, 201b, ..., 201n (to be described later). The transfer base 145 is moved, so that a lot having a predetermined number of wafers can be transferred. A wafer transfer mechanism 140a can transfer the wafers by a unit of lot from the loader 100 to a first-stage cleaning unit 201a, and from the first-stage cleaning unit 201a to a second-stage cleaning unit 201b. A wafer transfer mechanism 140b can transfer the wafers from the first-stage cleaning unit to the second-stage cleaning unit. A wafer transfer mechanism 140n can transfer the wafers from (n−1)th-stage cleaning unit 201n to nth cleaning bath 140n, and from nth-stage cleaning unit 201n to the unloader section 300.

The wafers can be transferred between adjacent cleaning units 201b, which are provided through a second-stage cleaning bath (interface bath) 202 (to be described later). Also, the wafers can be mounted on a wafer holder 212 (see FIG. 4) (to be described later), which is provided to a predetermined chemical liquid cleaning bath 202 or water cleaning baths 203, 204 and 205. The bath 203 can be selectively used for water cleaning or chemical cleaning.

The following will explain the cleaning section 200.

As shown in FIG. 1, a plurality of cleaning units 201a, 201b, ..., 201n including first-stage cleaning unit to nth cleaning unit are arranged in order. Each of the cleaning units comprises the chemical liquid cleaning bath 202, first-stage water cleaning bath 203, and a second-stage water cleaning bath 204. First, wafers W are cleaned in the chemical liquid cleaning bath 202. The wafers to which the chemical liquid are adhered are washed off with pure water in the first and second stage water cleaning baths 203 and 204. Then, the wafers are transferred to the cleaning unit, which is placed at the lower stream than the wafer transfer mechanism 140. Moreover, a final water cleaning bath 205 and a dry process bath 206 are sequentially arranged at the lowest stream of the cleaning section 200. In the final water cleaning bath 205, the wafers are cleaned with pure water. In the dry process bath 206, the finally cleaned wafers are dried with IPA (isopropyl alcohol). As mentioned above, a series of cleaning process can be carried out.

In each of the cleaning units, predetermined chemical liquid is introduced to the process bath in accordance with the kind of contaminant adhered to the surface of the wafer, such as organic impurity or metallic impurity. For example, in the case of the organic contaminant, the so-called SC1 cleaning, which uses the mixture of aqueous ammonia and hydrogen peroxide, can be performed. Also, the so-called HF cleaning using HF hydrofluoric aqua can be performed, thereby a natural oxide film and metallic impurity can be removed. Moreover, the so-called SC2 cleaning using the mixture of hydrochloric acid and hydrogen peroxide can be performed. Thereby, a pure natural oxide film can be grown on the wafer as metallic impurity, which is adhered onto bare silicon, is removed. Furthermore, in the case of the typical cleaning method using hydrogen peroxide as a base, the so-called RCA cleaning method, the wafers can be cleaned by the cleaning units, which respectively correspond to SCI→cleaning→HF cleaning→SC2 cleaning.

Figure 4:
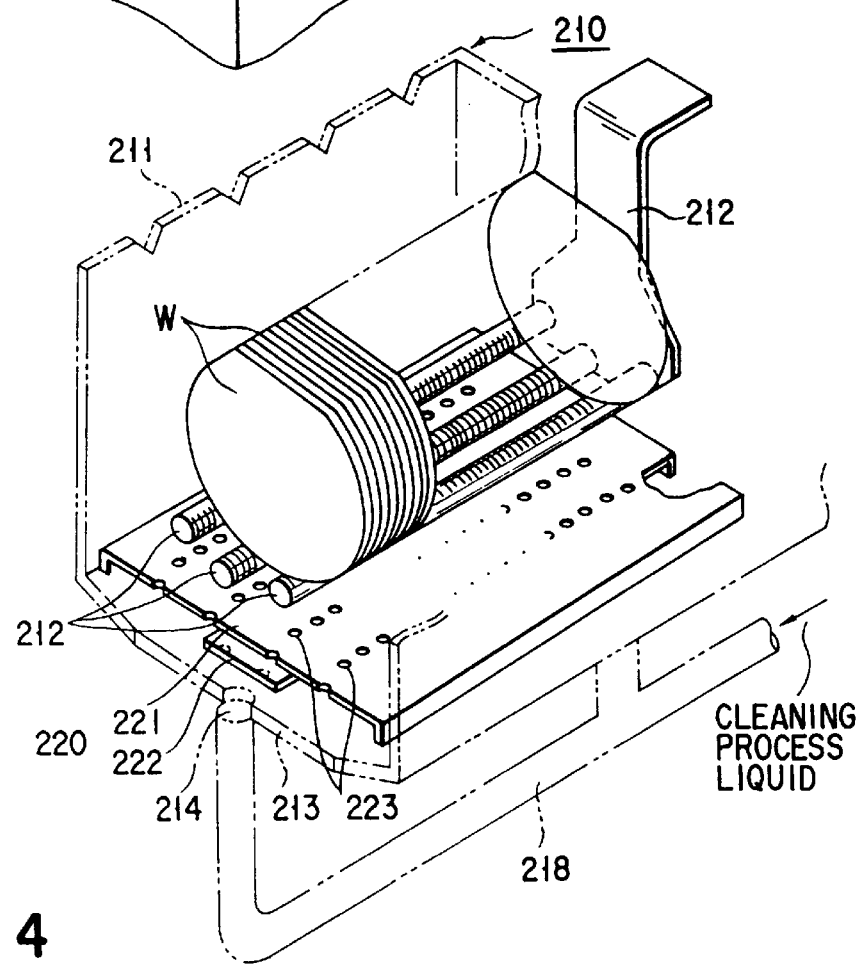
FIG. 4 is a schematic perspective view showing a part of a cleaning bath of the cleaning machine of FIG. 1.
Figure 5:
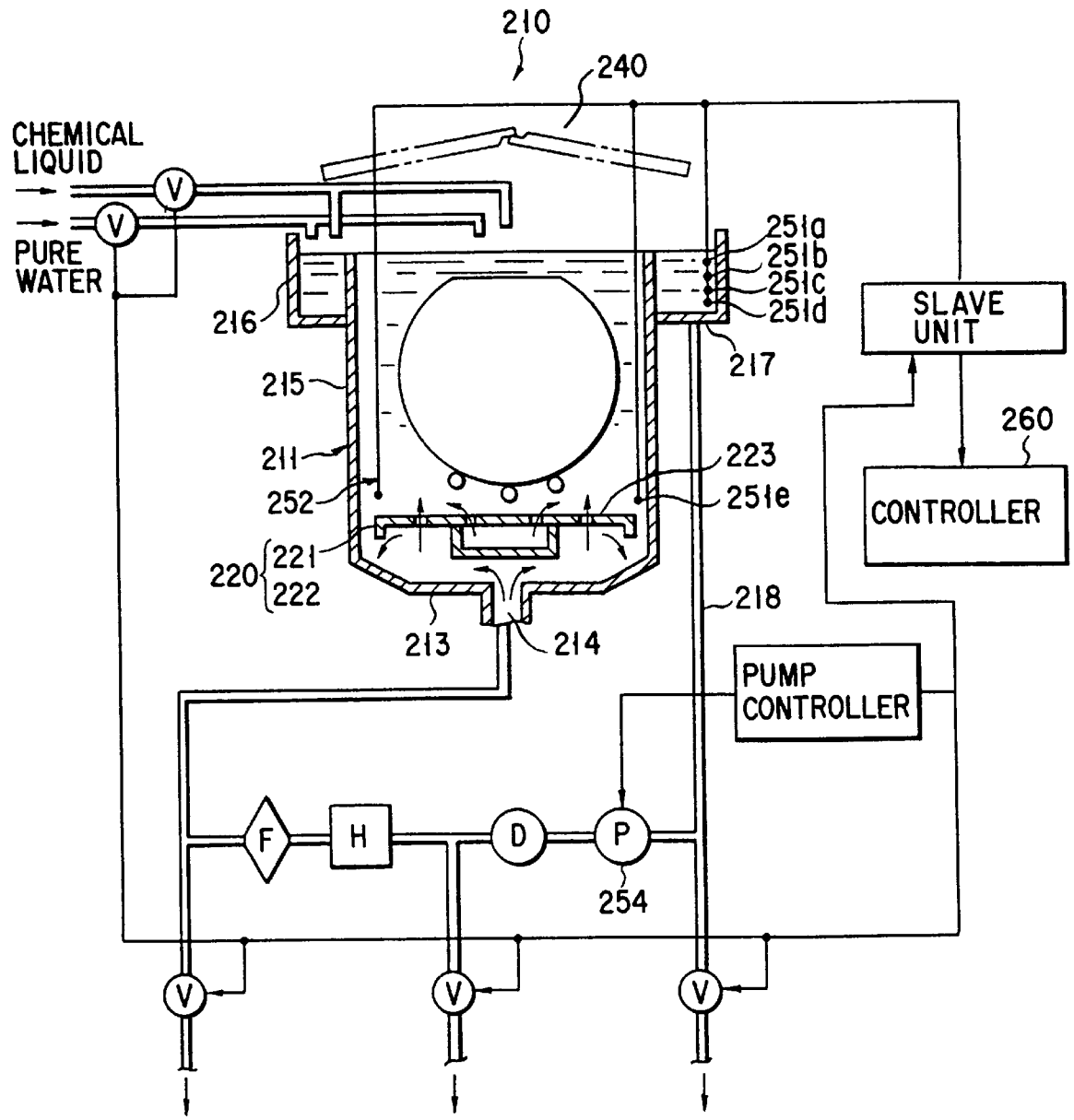
FIG. 5 is a view showing a chemical liquid circulating system of the cleaning bath of FIG. 1.

FIGS. 4 and 5 explain the structure of the typical process bath, which can be applied to the cleaning machine of the present invention. In this case, for example, an SCI cleaning bath section 210 will be explained. Since the other kinds of chemical liquid cleaning baths and the water cleaning baths are substantially the same as the SCI cleaning bath in the basic structure, the specific explanation is omitted.

As shown in FIG. 4, the process bath section 210 comprises a box-shaped process bath 211 and the wafer holder 212. The process bath 211 contains SCI cleaning chemical liquid, which is the mixture of aqueous ammonia, which is highly heated, and hydrogen peroxide. The wafer holder 212 is provided in the process bath 211 to vertically hold, e.g., 50 wafers W. Moreover, a supply port 214 for cleaning chemical liquid is formed on a bottom 213 of the process bath 211. Then, cleaning liquid is introduced to the bath from the supply port 214. The cleaning liquid is equally supplied to the surroundings of the wafers without generating turbulent flow by a rectifier 220. The rectifier 220 is provided between the holder 212 and the bottom 213.

More specifically, the rectifier 220 comprises a rectifying board 221 and a diffusion disk 222. The rectifying board 221 is horizontally provided to divide the process bath 211 into upper and lower sections. The diffusion disk 222 is provided at the upper portion of the supply port 214. A large number of small holes 223 is formed on the rectifying board 221. Chemical liquid introduced from the supply port 214 collides with a back surface of the diffusion disk 222. As a result, chemical liquid is diffused to the entire back surface of the rectifying disk 222 from the peripheral edge of the rectifying board 221. Thereafter, chemical liquid is passed through the small holes 223 of the rectifying board 221 so as to be supplied to the surroundings of the wafers W held by the wafer holder 212. Due to this, chemical liquid surrounds the wafers W at an even flow velocity without generating turbulent flow. Thereby, the entire wafers W are uniformly cleaned. The process bath 211 comprises an inner bath 215 and an outer bath 216. In the inner bath 215, the wafers W contained in the wafer holder 212 can be dipped in process liquid. The outer bath 216 can receive process liquid overflowing from the upper end of the inner bath 215. A chemical liquid circulation loop 218 is connected between the supply port 214, which is formed at the bottom 213 of the inner bath 215, and a discharge port 217, which is formed at a bottom of the outer bath 216. In the chemical liquid circulation loop 218, there is a circulation pump P, a damper D, a heater H, and a filter F. Chemical liquid overflowed to the outer bath 216 from the inner bath 215 is cleaned through damper D, heater H, and filter F to be circulated and supplied to the inner bath 215 again.

Figure 6:
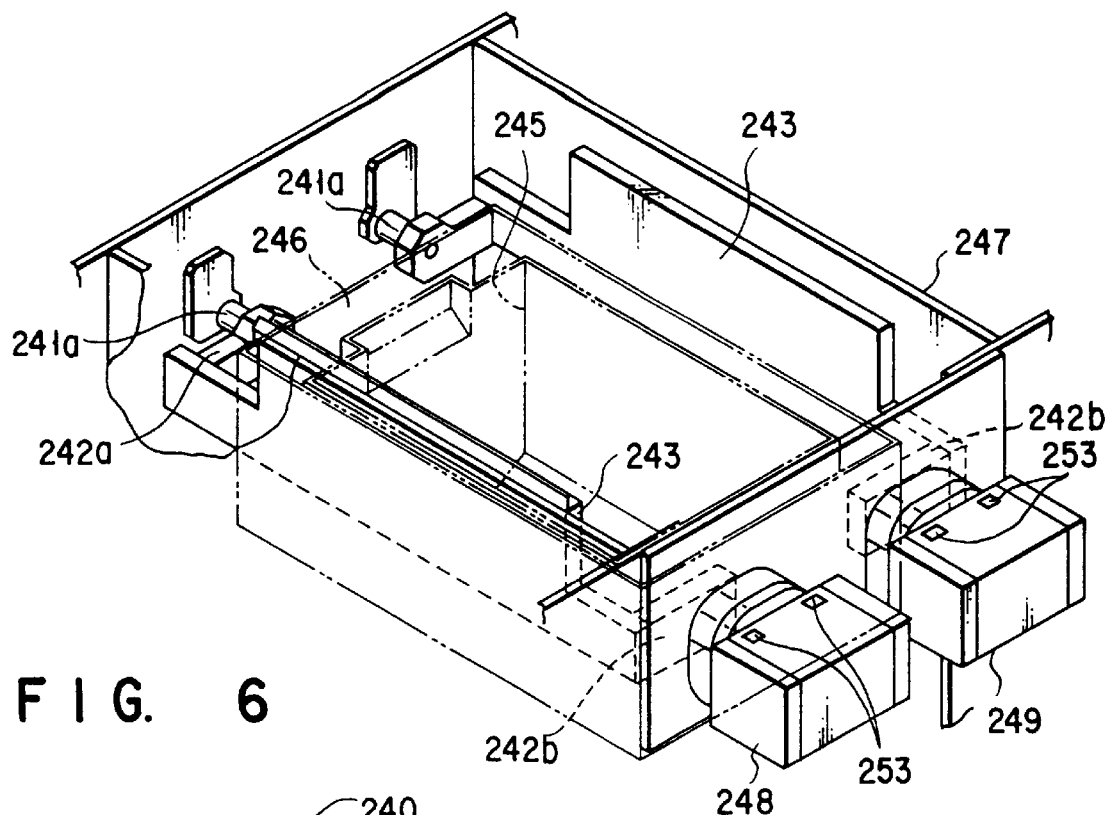
FIG. 6 is a perspective view of a cover of the cleaning bath of FIG. 5.
Figure 7:
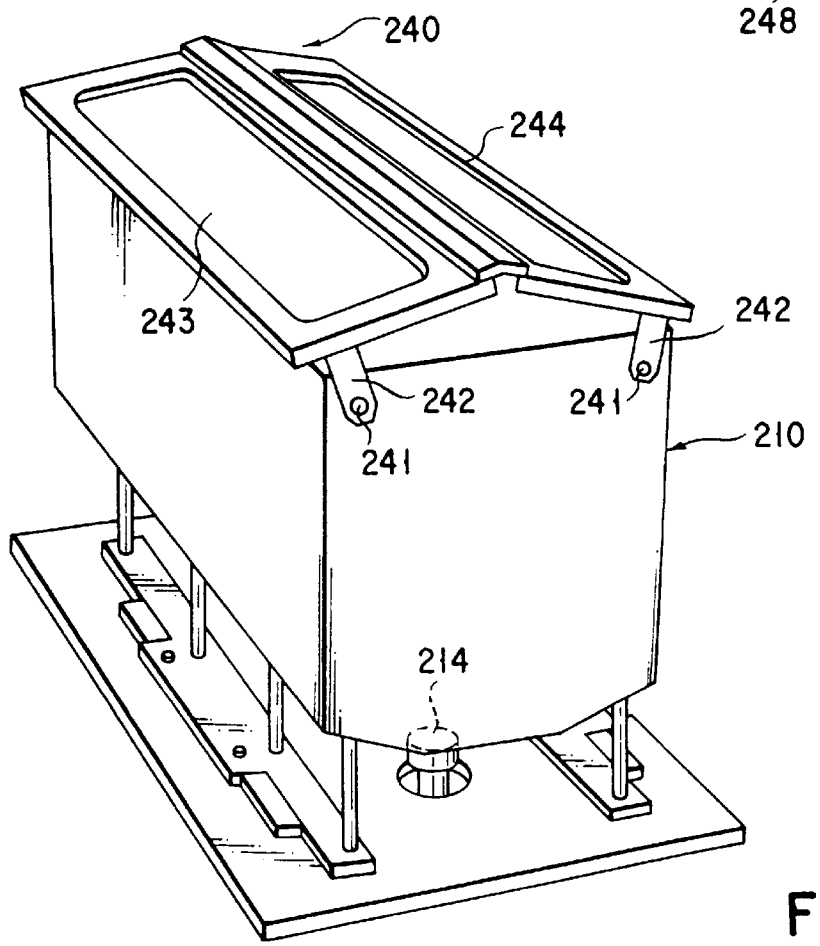
FIG. 7 is a perspective view of the cleaning bath of FIG. 6.
Figure 8:
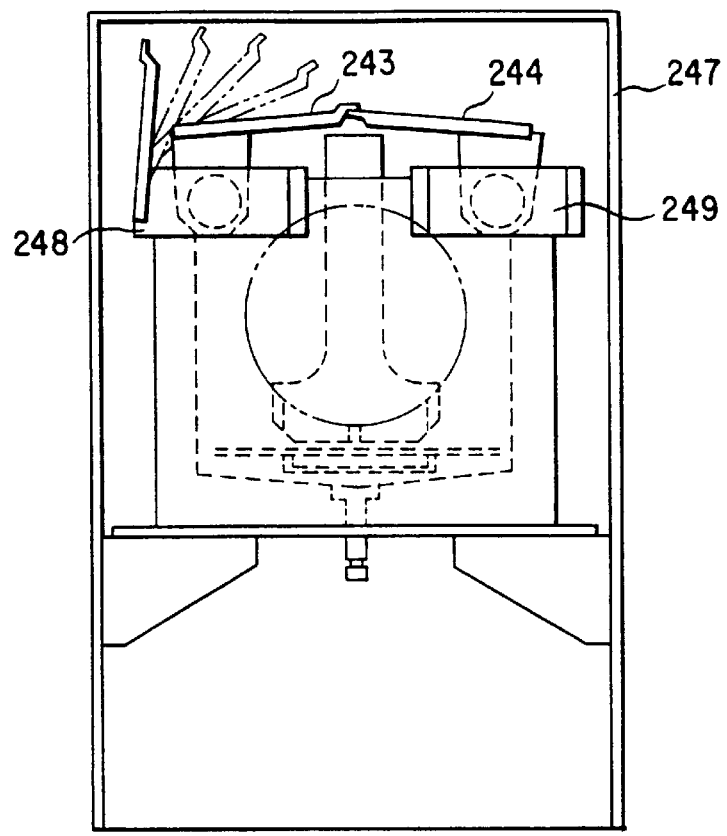
FIG. 8 is a side view of the cleaning bath of FIG. 7.

An opening/closing cover 240 is attached to the upper opening portion of the process bath 211. The cover 240 is closed so as to prevent vaporized process liquid from being diffused. Also, contaminants and dust can be prevented from being externally introduced to the processing bath section 210. As shown in FIGS. 6 to 8, the cover 240 comprises a pair of cover plates 243, which are fixed to movable arms 242a and movable arms 241b. The movable arms 242a are projected from two rotating shafts 241a provided to a frame 247 of the bath section 210, respectively. The movable arms 242b are projected from shafts of rotary actuators 248 and 249, respectively. When the rotary actuators 248 and 249 are rotated, the cover plates 243 are rotated in a state that the rotating shafts 241a are used as shafts. Thereby, the cover plates 243 are opened/closed as shown in FIG. 8.

Figure 9:
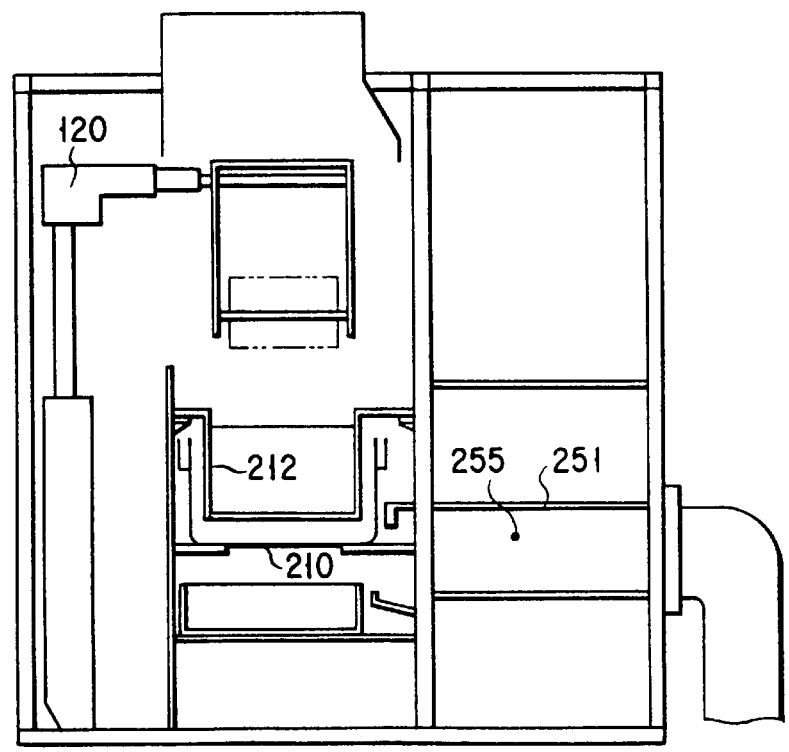
FIG. 9 is a side view of a cleaning unit.

As shown in FIG. 9, an exhaust duct 250 is provided at the lower horizontal portion of the process bath 211. Then, vaporized chemical liquid in the process bath 211 is suitably exhausted to an exhaust pipe line of a plant by an exhaust device such as a vacuum pump.

As shown in FIG. 5, in the process bath 211, there are provided various kinds of sensors such as a temperature sensor 252 for detecting a change of temperature of chemical liquid, an upper liquid-level sensor 251a for detecting a change of an upper liquid-level of chemical liquid, a normal liquid-level sensor 251b for detecting a normal liquid-level of chemical liquid, a supplement liquid-level sensor 251c for detecting a supplement liquid-level of chemical liquid, a lower liquid-level sensor 251d for detecting a lower liquid-level of chemical liquid, an empty sensor 251e for detecting an empty state of the process bath, a cover sensor 253 for detecting an opening/closing operation of the cover 243 of the process bath section 210, and a circulation loop sensor 254 for detecting abnormality of a circulation system of chemical liquid. Moreover, as shown in FIG. 9, an exhaust sensor 255 such as a manometer for detecting abnormality of an exhaust system is provided in the exhaust duct 250. Detection signals sent from these sensors are suitably supplied to a controller 260, and the cleaning machine is driven in an abnormal time process mode (to be described later). Sensors, which are put on the market or well-known can be used. However, since the object of the present invention is not to provide a sensor itself, the specific explanation of the sensors is omitted. Moreover, in the above-mentioned embodiment, the exhaust system is provided in the process bath section 210. However, the present invention is not limited to the above-mentioned embodiment. The exhaust system for exhausting the entire cleaning machine may be provided in an outer section of the process bath section 210.

As explained above, the cleaning section 200 of FIG. 1 is structured as shown in FIGS. 2 to 9. At the lower stream of the cleaning section 200, there is provided an unloader 300 for transferring wafers returned to the carrier C to the outside of the cleaning machine. However, the basic structure of the unloader 300 is substantially the same as that of the loader 100. Moreover, the processed wafers W can be transferred to the outside of the cleaning machine by carrying out the steps of the loader 100 in reverse. Due to this, the specific explanation is omitted. In other words, if the loader 100 is driven in reverse, it can function as an unloader for transferring the processed wafers W to the outside of the cleaning machine. In this case, the unloader 300 can be omitted.

The following will explain an operation of the above-structured cleaning machine 1.

(1) Normal process operation

First, carriers C1 and C2, each containing 25 unprocessed wafers W, are mounted on a loading position of a station 112 (FIG. 2) of the platform 110 of the loader 100 by a transfer robot (not shown).

The carriers C1 and C2 are sequentially clamped by a moving mechanism 115. Then, carriers C1 and C2 are sequentially moved to a mounting position of the station as the orientation flat alignment is carried out. Z base 123 is moved to the relay section 130 in the X direction in a state that the carriers C1 and C2 are simultaneously sandwiched between the arms 121a and 121b of the conveyer machine 120 at the mounting position. Then, the holding units 133 and 135 of the relay section 130 are moved upward in the Z direction, and the wafers W of the carriers C1 and C2 are transferred onto the holding units 133 and 135.

Sequentially, the first-stage wafer transfer mechanism 140a of FIG. 1 is moved to the relay section 130, and the wafer chuck 142 of FIG. 3 holds the aligned wafers W by a lot unit. The wafers W are transferred to SCI cleaning bath 202a of the first-stage cleaning unit 201a. Then, the wafers W are moved to the holder 212, which is provided in process liquid of the process bath 211 of FIG. 4 in advance, by a lot unit. After a predetermined SCI cleaning is provided to the wafers W, the wafers W are lifted up from the process bath by the wafer chuck 142 to be transferred to the first-stage water cleaning bath 203a. The wafers W are moved to the holder 212 of the water cleaning bath 203a, and the first-stage cleaning of the wafers W is executed with pure water.

Thereafter, by the same method, the wafers W cleaned with pure water are sent to the second-stage water cleaning bath 204a (FIG. 1), and the second-stage cleaning of the wafers W is executed with pure water. Thereby, chemical liquid adhered to the wafers W is completely cleaned. The second-stage water cleaning bath 204a is called an interface bath. The interface bath is positioned between the previous chemical liquid cleaning unit and the cleaning unit where cleaning is performed with different kind of chemical liquid. The interface bath has a function as a buffer for preventing both chemical liquids from being mixed with each other. In other words, in the case of this embodiment, the wafers W to which the SCI cleaning is provided in the chemical liquid cleaning bath 201a are cleaned with pure water. Thereafter, in the second-stage water cleaning bath 204a, serving as an interface bath, the wafers W waits for a next process of HF cleaning in the second-cleaning unit 201b, as required.

The wafers W are lifted up from the second-stage water cleaning bath 204a of the first-stage cleaning unit 201a by the second-stage wafer transfer mechanism 140b. Then, the wafers W are transferred to the HF chemical liquid bath 202b of the second-stage cleaning unit 201b for HF cleaning. After a predetermined chemical liquid process, the wafers W are cleaned in the first-stage water cleaning bath 203b. Then, in the second-stage water cleaning bath 204b, serving as a second interface bath, the wafers W wait till the previous cleaning process is ended. By repeating the similar steps, SC2 and the other necessary cleaning process are performed. Then, the wafers W are sent to the final water cleaning bath 205 so as be cleaned with pure water. Thereafter, the wafers W are sent to the dry process bath 206 to be vaporized and dried with IPA. The dried wafers are transferred to the outside of the cleaning machine through the unloader 300.

The above has explained a series of process flow in the normal process drive mode of the cleaning machine 1 to which the present invention can be applied. According to the present invention, if abnormality occurs in the chemical liquid bath of the cleaning machine, the wafers W wait for the following cleaning process.

(2) Abnormality detecting operation (2)-1 Abnormality of temperature

Figure 10:
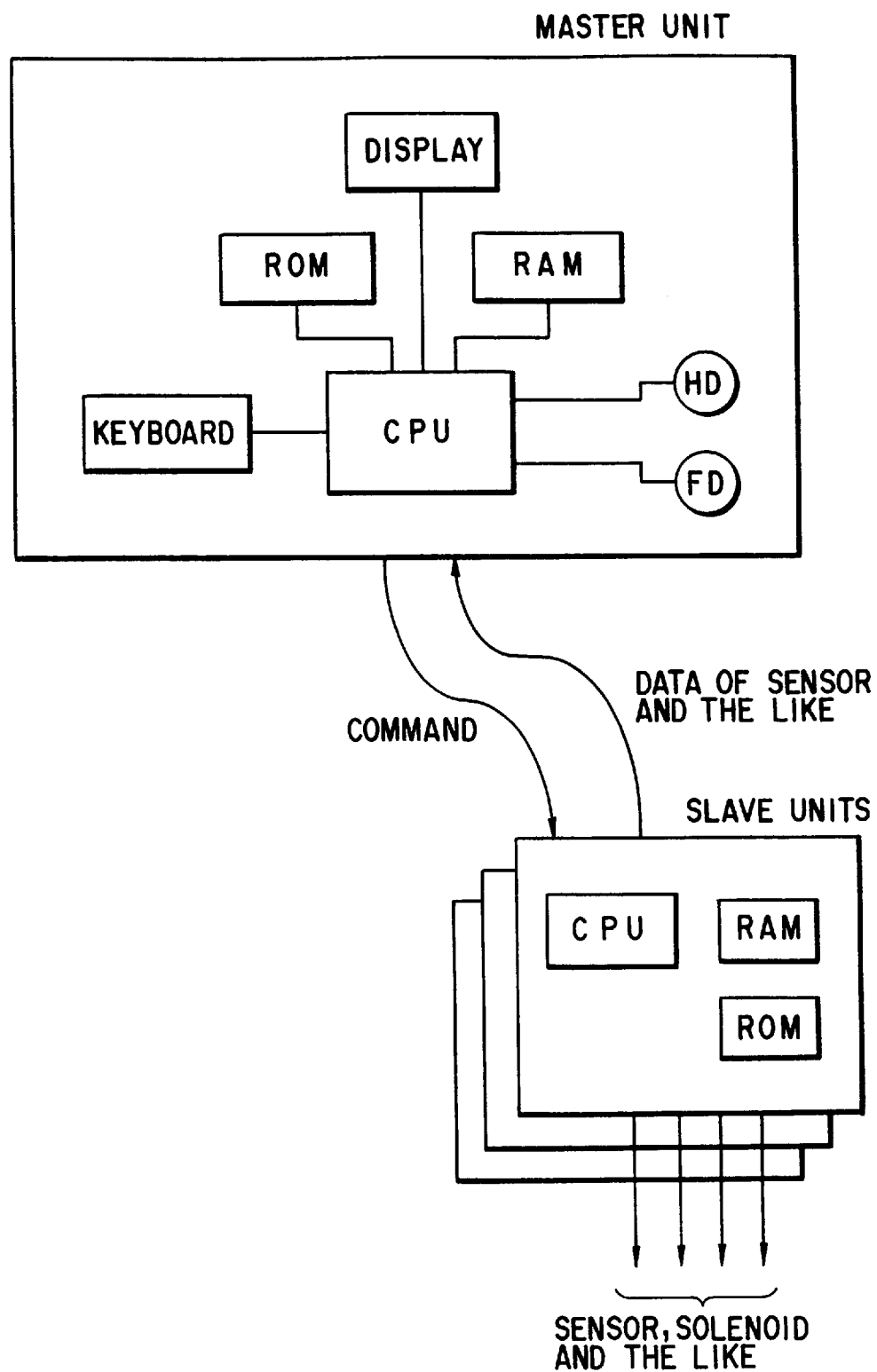
FIG. 10 is a view showing a control system of the cleaning machine.
Figure 11:
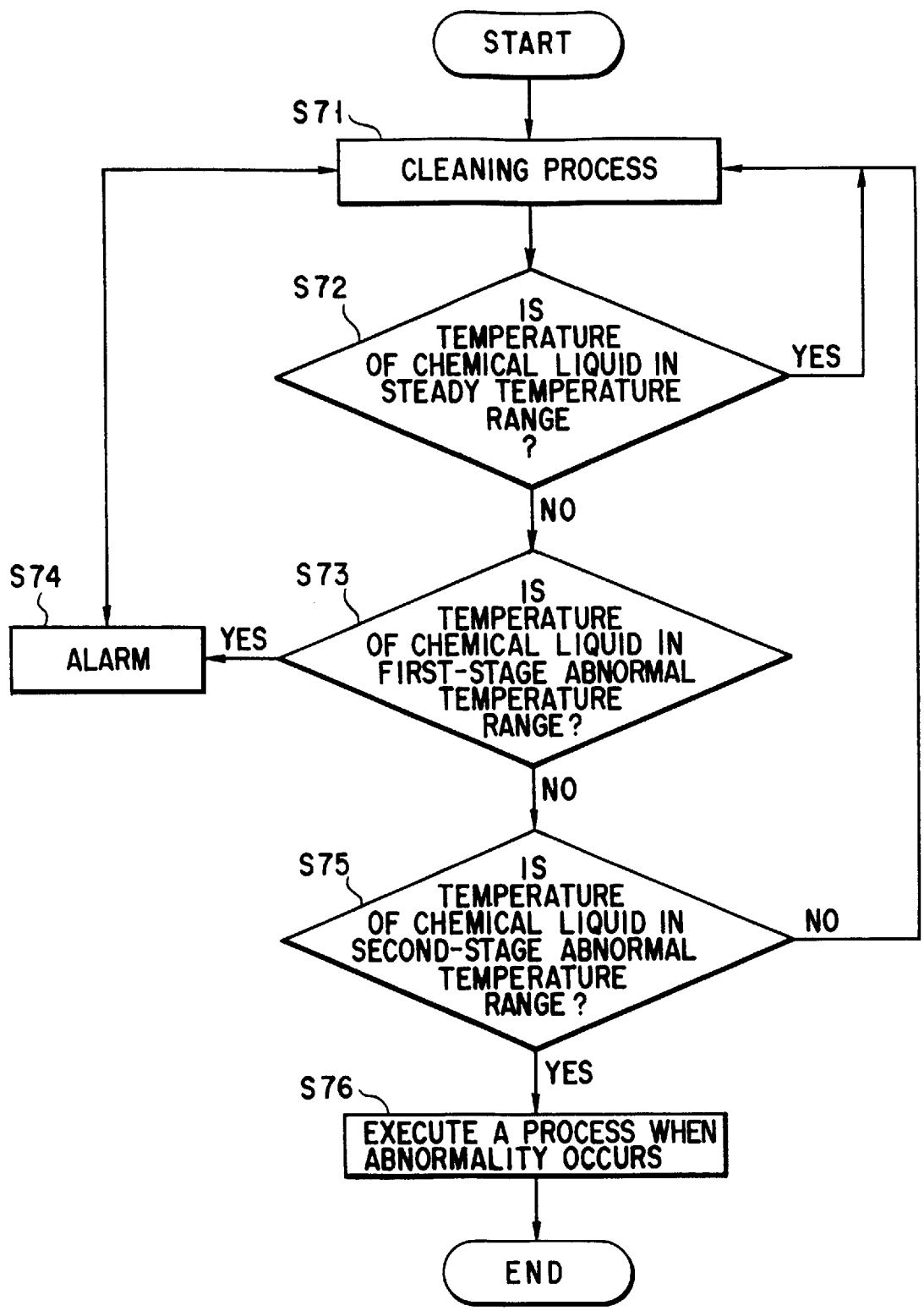
FIG. 11 is a flow chart showing a process flow when abnormality of temperature generated.

When the temperature sensor 252 detects an abnormal temperature value, an abnormal condition process mode is executed in accordance with the process flow of FIG. 11 by a controller 260 of FIG. 10. According to the present invention, an abnormal value can be set in a two step manner to execute a suitable abnormal condition process. For example, in the SCI cleaning process, if a steady temperature is set to 60° C. the first-stage abnormal temperature range is set to ±3° C. of the steady temperature, that is, 57° C. or less, or 63° C. or more, and the second-stage abnormal temperature range is set to ±5° C. of the first-stage abnormal temperature range, that is, 55° C. or less, or 65° C. or more. Similarly, in the SPM cleaning process where the cleaning process is performed at high temperature, if a steady temperature is set to 120° C., the first-stage abnormal temperature range is set to ±10° C. of the steady temperature, and the second-stage abnormal temperature range is set to ±15° C. of the first-stage abnormal temperature range. These temperature ranges can be input from a keyboard of a controller 260, serving as a master unit, and stored in a hard disk (HD) of the controller 260. These steady temperature first-stage abnormal temperature range and second-stage abnormal temperature range can be appropriately set in accordance with kinds of chemical liquids.

The following will explain a case in which abnormality of temperature is generated at the time of the SCI cleaning process with reference to FIGS. 10 and 11. In step S71, a cleaning process is executed. In step S72, the controller (master unit) 260 checks whether or not the temperature of chemical liquid to be measured by the temperature sensor 252 is the steady temperature (e.g., 60° C.) through a slave unit for fetching temperature data measured by the temperature sensor 252. In step S73, if the master unit (controller 260) discriminates that temperature of chemical liquid deviates from the normal temperature range and rises to the first-stage abnormal temperature range (57° C. or less, or 63° C. or more), for example, 64° C. , the master unit raises an alarm to an operator with indicating light of a pilot lamp in step S74. If the temperature of chemical liquid further rises and the master unit discriminates that the temperature is in the range of the second abnormal temperature range (55° C. or less or 65° C. or more) in step S75, the master unit executes an abnormal condition process (process for measurement against abnormality) (step S76) to be described in FIGS. 17 and 18 later.

(2)-2 Abnormality of liquid-level

As mentioned above, in the process bath 211, liquid-level sensors 251a to 251e are provided. The mater unit checks whether or not an amount of chemical liquid, which is supplied to the process bath 211 and circulated therein at the time of cleaning process (step S81), is suitable through the slave unit based on liquid-level data detected by these liquid-level sensors. In other words, in step S82, if the master unit discriminates that the amount of chemical liquid deviates from the steady value through the slave unit based on liquid-level data detected by these liquid-level sensors, the master unit checks whether or not the liquid-level is sufficient for dipping the wafers in step S83. If the master unit discriminates that the liquid-level is sufficient for dipping the wafers, the master unit raises only an alarm in step S84. If the master unit discriminates that the liquid-level drops to a level where the cleaning process cannot be continued, the master unit executes an abnormal condition process (process for measurement against abnormality) (step S86) in accordance with the flows of FIGS. 17 and 18.

(2)-3 Abnormality of exhaust system

As shown in FIG. 9, in the exhaust system of the process bath section 210, the exhaust sensor 255 such as a manometer is provided to check the exhaust state. More specifically, as shown in FIG. 13, in step S91, the cleaning process is executed. In step S92, the master unit checks whether or not exhaust is sufficiently carried out through the slave unit based on the value measured by the manometer. If an amount of exhaust is less than a predetermined range and the master unit discriminates that exhaust is abnormal, the master unit raises only an alarm in step S93. At this time, the master unit checks how long abnormality of exhaust is continued in step S94. If abnormality of exhaust is continued for more than predetermined period of time (more than 10 minutes in the case of AMP, and more than 30 seconds in the case of HF), there is the possibility that exhaust will not sufficiently performed and that the structural parts of the process bath will be contaminated and damaged. Due to this, the master unit executes an abnormal condition process (step S95) in accordance with the flows of FIGS. 17 and 18.

(2)-4 Abnormality of circulation system

Figure 14:
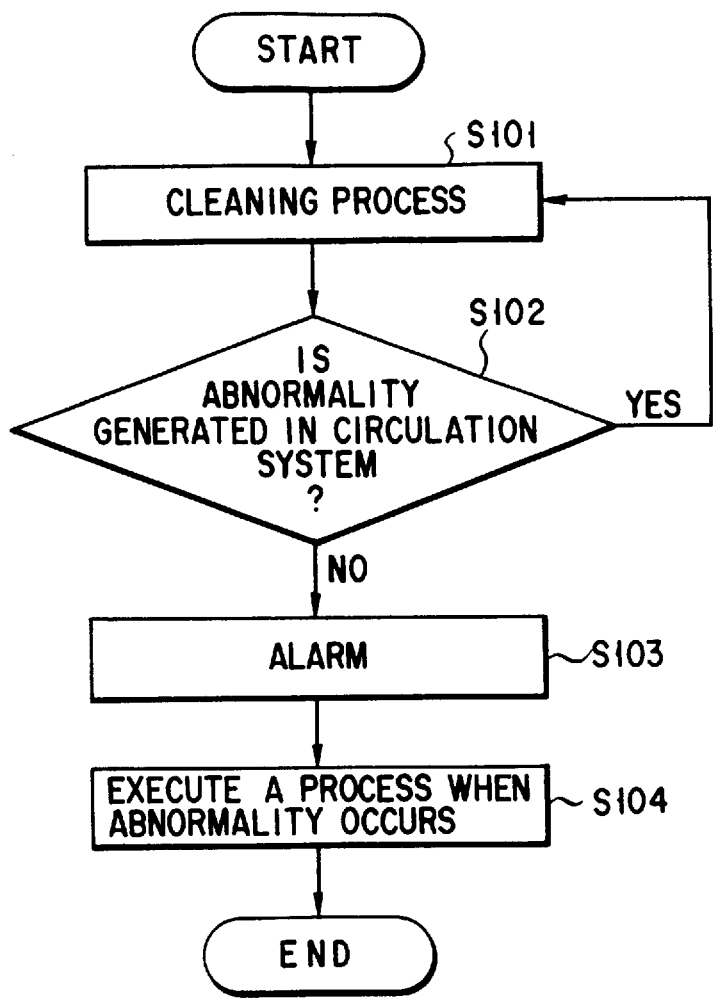
FIG. 14 is a flow chart showing the chemical liquid circulating system.

Chemical liquid supplied to the chemical liquid bath 211 is circulated by the circulation loop 218 having the circulation pump P and the filter F as being cleaned. However, if abnormality of chemical liquid circulation system, which is caused by trouble of the circulation pump P, etc., is detected by the sensor for detecting the abnormality of the circulation system, the master unit executes a process in accordance with a flow shown in FIG. 14. More specifically, in step 101, the cleaning process is executed. Then, in step S102, the master unit checks whether or not the circulation system is normally operated through the slave unit based on data of the sensor 254. If abnormality of the circulation system due to the stop of the circulation pump is detected, the master unit raises an alarm in step S103. In this case, the master unit executes an abnormal condition process (process for measurement against abnormality) (step S104) in accordance with the flows of FIGS. 17 and 18.

(2)-5 Abnormality of cover open/close mechanism

In the process bath, there is provided the sensor 253 for detecting abnormality of the cover open/close mechanism. The master unit checks whether or not an operation of the sensor is abnormal in accordance with the flows of FIGS. 15 and 16. More specifically, the master unit discriminates that a predetermined cleaning process (step S111) is ended in step S112. If the cover open/close mechanism of the liquid bath is normal, the cover is opened and the wafer transfer mechanism operates to transfer the wafers of the process bath in step S113. However, if abnormality of the cover open/close mechanism is detected in step S113, the processed lot cannot be transferred. Due to this, the master unit executes waste water and pure water supply processes as an abnormal condition process (process for measurement against abnormality) in accordance with the flow of FIG. 18 in step S115, thereby improving the safety of the wafers in step S115.

Also, as shown in FIG. 16, it is confirmed that the wafers are transferred to the process bath in step S121. Thereafter, the master unit checks whether or not the cover of the process bath can be closed in step S122. If the cover can be closed, the process goes to step S123 so as to execute the normal cleaning process. If the cover cannot be closed, the process goes to step S124, and the master unit executes the abnormal condition process in accordance with the flows of FIG. 18 so as to improve the safety of the wafers.

(3) Abnormal condition process

If abnormality of the process bath is detected by the various kinds of sensors provided in the process bath, an auto take-out operation of FIG. 17 or an auto chemical liquid/pure water replacement operation of FIG. 18 can be executed.

(3)-1 Auto take-out operation

FIG. 17 schematically shows a process flow of the auto take-out operation. If abnormality of the process bath is detected in the flows of FIGS. 11 to 14, an abnormal condition process (process for measurement against abnormality) system is set to execute the auto take-out operation. In this case, the process automatically goes to step S131. In step S131, the wafers W of the process bath 211 are transferred by the wafer transfer mechanism 140. Then, the wafers W are moved from the process bath 202 where trouble has occurred to the first-stage water cleaning bath 203, which is positioned at the lower stream of the process bath 202, or the second-stage water cleaning bath 204 to save the processing lot. In step S132, if no damage is generated in the transferred lot and the operator judges it unnecessary to take out the lot, serving as a normal lot, to the outside of the cleaning machine, the process goes to step S133. Then, the normal process is continued. However, the operator judges it necessary to take out the transferred lot, the lot is sequentially transferred to the final water cleaning bath 205 through the interface bath 204 in step S134. Moreover, the operator judges whether or not a drying process is executed in step S135. If the operator judges it unnecessary to execute the drying process, the lot is maintained as it is. If it is necessary to execute the drying process, the drying process is executed in step S136 so as to be transferred from the unloader 300 to the outside of the cleaning machine. If the wafer process is interrupted by generation of trouble, process conditions such as process time up to the interruption and/or residual necessary process time are recorded to the controller 260. Such process conditions are provided to a user as reference data for the following process.

As mentioned above, according to the present invention, the cleaning machine is set to an auto take-out mode. Thereby, the processing lot can be automatically transferred to the water cleaning bath when trouble occurs in the chemical liquid bath. Therefore, damage of the wafers due to trouble can be limited to a minimum.

(3)-2 Auto chemical liquid/pure water replacement operation

The process can be set to an auto chemical liquid/pure water replacement mode if trouble is generated in the process bath. In this mode, as shown in FIG. 18, if abnormality is detected in the process bath, the process goes to step S141. In step S141, chemical liquid of the process bath is automatically discharged as waste liquid, and pure water is introduced to the process bath to protect the processing wafers. Moreover, the take-out operation of the lot is executed in accordance with the flow of FIG. 17 as required (step S143).

As mentioned above, according to the present invention, the process can be moved to the auto chemical/pure water replacement mode thereby making it possible to improve the safety of the processing wafers if the following cases are generated.

More specifically, trouble is generated in the cover open/close mechanism, and the processed lot cannot be transferred. In other words, there is generated an emergent state, which cannot be satisfactorily processed by the auto take-out function.

In this case, if the wafer process is interrupted by generation of trouble, process conditions such as process time up to the interruption and/or residual necessary process time are recorded to the controller 260. Such process conditions are provided to a user as reference data for the following process.

As mentioned above, the embodiment of the present invention was explained with reference to FIGS. 1 to 18. However, the present invention is not limited to the above-explained embodiment. For example, the present invention can be applied to all possible trouble such as water leakage from the chemical liquid bath, abnormality of N2, abnormality of concentration of chemical liquid, and the like.

In this specification, an abnormal signal was classified into a first-stage abnormal signal, which is in the first-stage abnormal range, and a second-stage abnormal signal, which is in the second-stage abnormal range. However, this classification means that the abnormal signal is classified into a signal for automatically executing the abnormal condition process and a signal for executing the other processes. In other words, it should not be interpreted that the cleaning machine is controlled by only two kinds of signals. In the category of the technical concept of the present invention, one skilled in the art can infer that the cleaning machine can be controlled by various types of signals. Also, it can be understood that the control of the machine by various types of signals belongs to the scope of the present invention.

Moreover, regarding the abnormal condition process, the above embodiment individually explained the auto take-out operation and the auto chemical liquid/pure water replacement operation. However, the auto take-out operation and the auto chemical liquid/pure water replacement operation may be selectively executed. In other words, the auto take-out operation is executed prior to the auto chemical liquid/pure water replacement operation. Then, if the auto take-out operation cannot be executed, the operation may be moved to the auto chemical/pure water replacement operation. The auto chemical liquid/pure water replacement operation may be executed prior to the auto take-out operation. After the auto chemical liquid/pure water replacement, the auto take-out operation may be executed.

Furthermore, the above embodiment explained the cleaning machine in which the cleaning units, each having one chemical liquid cleaning bath and two water cleaning baths, are combined with each other. However, the present invention is not limited to the above embodiment. The present invention can be applied to the cleaning machine in which various kinds of process baths, e.g., cleaning units including a plurality of chemical liquid cleaning baths for executing a process with the same kinds of chemical liquid, or cleaning units including only one water cleaning bath, are combined.

As mentioned above, in the cleaning machine, all lots are sequentially cleaned by the sequentially arranged cleaning units in accordance with a predetermined process recipe. However, in the actual process, there is a case in which the same cleaning process is not required to all lots. For example, cleaning of the Nth lot, which is performed in the first-stage cleaning unit, is needed. However, in the first-stage cleaning unit, cleaning of Nth+1 is not needed. Instead, in the second-stage cleaning unit and the following units, cleaning of Nth+1 is needed. In such a case, if the lot jumps over the first-stage cleaning unit, the cleaning of lot can be efficiently executed.

The following will explain an embodiment in which the lot can selectively jump over the cleaning process unit with reference to FIGS. 19 to 23.

For example, in the chemical liquid bath 202(n) of the n-stage cleaning unit 201(n), cleaning of the Nth lot is needed. However, if cleaning of the following Nth+1 lot is needed in n-th cleaning unit 201(n), the wafers W of Nth+1 lot, which is placed in the interface bath 204(n−1) of the n−1-stage cleaning unit 201(n−1), are lifted up by n-stage wafer transfer mechanism 140(n). Then, the wafers W are jumped over the Nth lot to be transferred to the interface bath 204(n) of the n-stage cleaning unit 201(n). Also, as shown in FIG. 21, the n-stage wafer transfer mechanism 140(n) is returned to the original position. Thereafter, prior to Nth lot, Nth+1 lot can be transferred to n+1-stage cleaning unit 201(n+1) of the next step by n+1-stage wafer transfer mechanism 140(n+1). Moreover, as shown in FIG. 22, the nth-stage wafer transfer mechanism 140(n) is moved up to the upper portion of the chemical liquid bath 202(n). Thereafter, the nth lot whose chemical cleaning is ended in the chemical liquid bath 202(n) is transferred to the first-stage water cleaning bath 203(n) so as to be cleaned with pure water. As shown in FIG. 23, the Nth lot cleaned with pure water in the first-water cleaning bath 203(n) is transferred to second-stage water cleaning bath 204(n), and waits for the next step.

Figure 24:
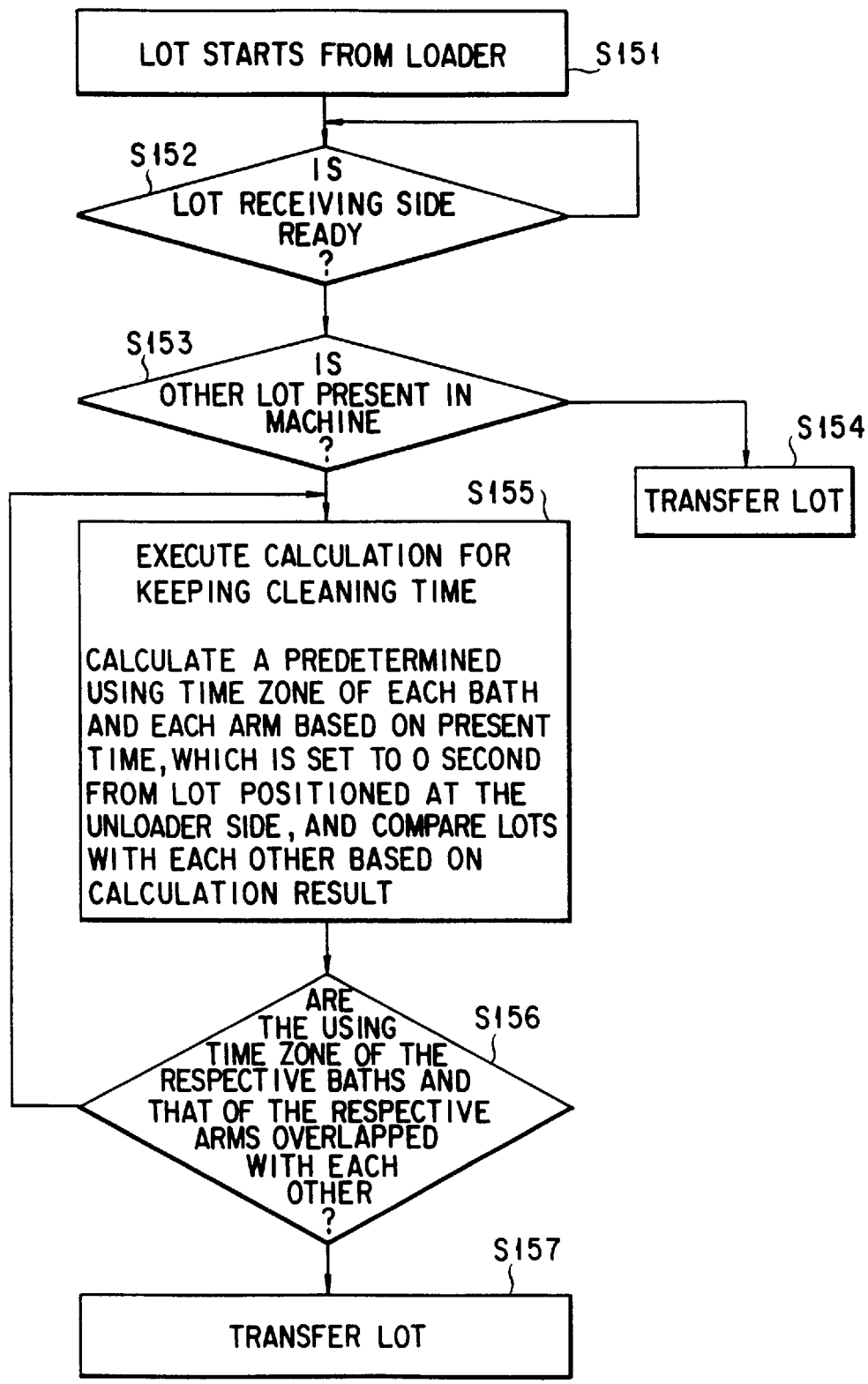
FIG. 24 is a flow chart to explain a jump mode operation.

The above-mentioned jumping operation is controlled by the controller 260. The control of the jumping operation will be explained with reference to the flow chart of FIG. 24.

In step S151, the wafer lot is started to be fetched from the loader. At this time, the controller 260 checks whether or not the lot can be received on the cleaning unit 201(n) in step S152. If the lot can be received to the cleaning unit 201(n), the controller 260 confirms whether or not the other lot is present in the cleaning unit in step S153. If the other lot is not present in the cleaning unit, the controller 260 controls the lot fetched to the wafer transfer mechanism 140(n) to be transferred to the cleaning unit. If the other lot is present in the cleaning unit, a calculation for keeping cleaning time is executed by the controller 260. In other words, a predetermined using time zone of each bath and each arm is calculated based on present time, which is set to 0 seconds from the lot positioned at the unloader side (e.g., lot in the water cleaning bath 204(n)). The result of the calculation is compared between the lots. As a result of the comparison, it is checked whether or not the using time zone of the respective baths and that of the respective arms are overlapped with each other. If the result is YES, the process is returned to step S155. If the result is NO, the lot is transferred to the process bath corresponding to the wafer transfer mechanism.

As is obvious from the above-mentioned series of operations, according to the present invention, the following lot can jump over the preceding lot as required. Due to this, the process end time of the following lot can be largely reduced.

The above embodiment explained the step of the transferring the wafers in the jump mode in which the following lot jumps over the preceding lot while the preceding lot is being processed in the chemical liquid bath. However, even in a case where no preceding lot is present, the lot jumps over an arbitrary chemical liquid bath so as to be transferred to the water cleaning bath, which is positioned at the lower stream of the chemical liquid bath. Therefore, if the chemical liquid bath in which no process is needed is specified in advance, the cleaning process flow in which the lot jumps over only the specified bath can be continuously executed. As a result, according to the present invention, the cleaning machine comprises a GCM (greatest common measure) number of kinds of cleaning units, and arbitrary cleaning units are combined with each other as required. Thereby, the cleaning process flow can be executed. Therefore, various kinds of cleaning processes can be executed by one cleaning machine, and thus a cleaning system having a good cost/performance can be structured.

Moreover, for detecting which chemical liquid bath causes trouble in the jump mode in a case where trouble occurs in the cleaning machine, a dummy wafer for detection can be selectively sent to the chemical liquid bath of each of the cleaning process units. Therefore, the time which is needed to detect the trouble bath can be largely reduced.

The above embodiment explained the example in which the first-stage water cleaning bath and the second-stage water cleaning bath are provided at the lower stream of the chemical liquid bath. However, the present invention can be applied to a case in which cleaning units, each having only one water cleaning bath provided at the lower stream of the chemical liquid bath, are combined with each other. In this case, the water cleaning bath is used as an interface bath, thereby the wafers can be transferred in the jump mode.

If the same process liquid is used for a long period of time or many lots are used in the cleaning process, process liquid is gradually contaminated or deteriorated due to chemical reaction. Due to this, the cleaning process cannot be sufficiently performed. Normally, the entire chemical liquid is replaced with new chemical liquid after waiting predetermined chemical liquid replacement time. The following methods are used to know when chemical liquid is replaced with new chemical liquid.

More specifically, degree of deterioration of chemical liquid is detected by an appropriate detector. Then, when the deterioration reaches a predetermined level or more, chemical liquid is replaced with new chemical liquid. Also, there is a method in which chemical liquid is forcibly replaced with new chemical liquid at a predetermined period. Further, there is a method in which chemical liquid is forcibly replaced with new chemical liquid when a predetermined number of lots is processed. However, according to these methods, the following series of replacement processes is continuously performed.

More specifically, at the time of replacement of chemical liquid, a valve V for waste liquid is released, and deteriorated chemical liquid is discharged from the process bath 211. Then, the discharged chemical liquid is circulated in the process bath 211 to be cleaned. Thereafter, new chemical liquid is introduced to the process bath 211 from the chemical liquid/pure water supply line 219 to be circulated therein.

Figure 25:
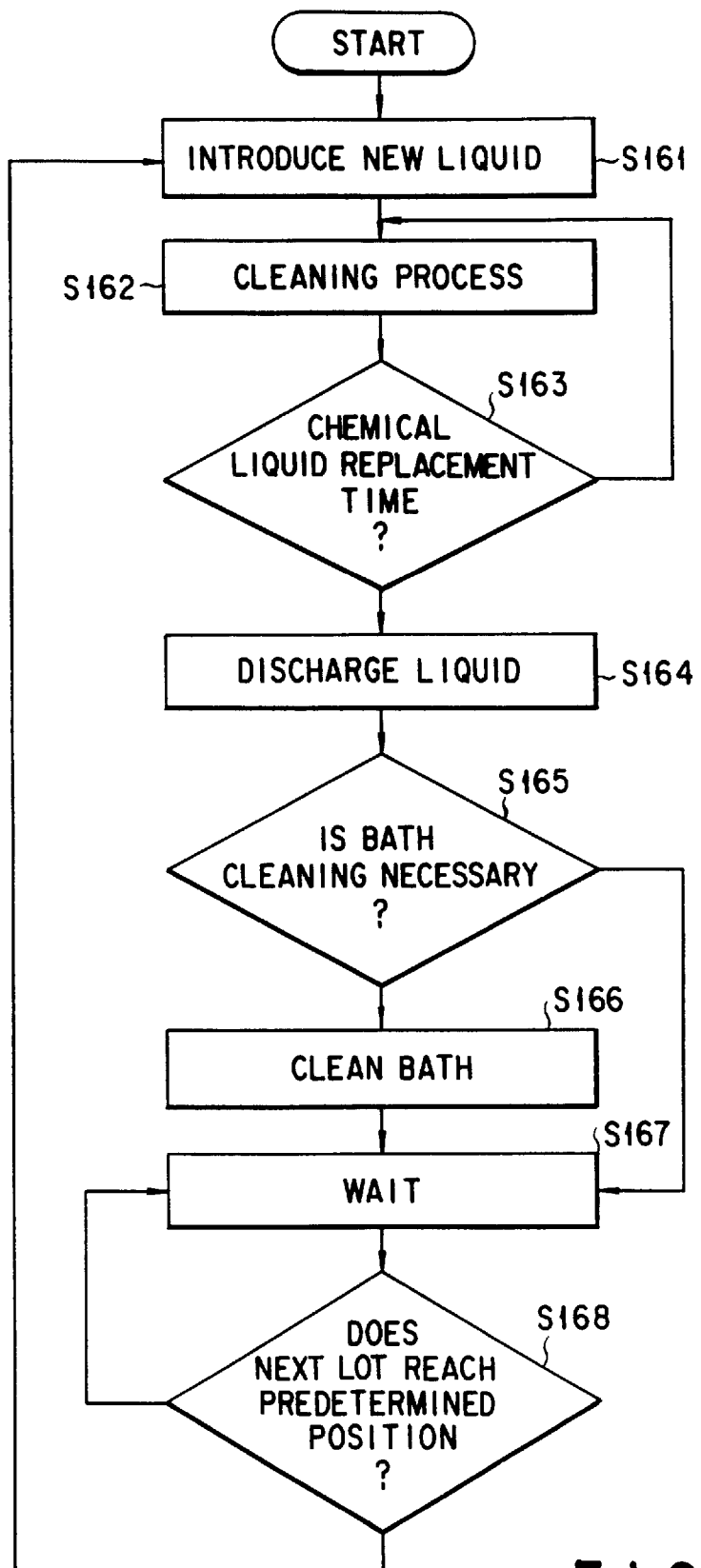
FIG. 25 is a flow chart to explain a chemical liquid replacement operation.

The above new chemical liquid is started to be deteriorated at the same time when being introduced. Due to this, in a case where a long period of time is needed to start the next lot process from the replacement process, there occurs a case in which deterioration of chemical liquid progresses even if the actual process is not performed. To solve such a problem, according to the present invention, the replacement of process liquid is executed by the controller 260 in accordance with a flow of FIG. 25.

More specifically, in step S161, new process liquid is introduced to the process bath. Then, in step S162, a normal cleaning process is continued. The controller 260 releases the valve V for waste liquid (FIG. 5) to automatically discharge waste liquid in step S164 when it recognizes time for replacement of chemical liquid based on the conditions that a predetermined period of time is passed after the introduction of process liquid or the number of the lots which have been processed by the process liquid reach to a predetermined value.

Thereafter, the controller 260 determines whether or not it is necessary to clean the process bath 211 where waste liquid is discharged with pure water in step S165, on the basis of the preset parameters stored in the hard disk. If the result is YES, the controller 260 releases the valve V to supply pure water to the process bath 211 to clean the process bath with pure water.

If the result is NO in step S165 or the cleaning of the bath is ended in step S166, the cleaning bath is in an empty state, and the cleaning unit corresponding to the cleaning bath is set to be in a standby state in step S167. At this time, the controller 260 detects whether or not the next lot reaches a predetermined position in step S168. If the next lot reaches the predetermined position, new chemical liquid is started to be introduced to the process bath by arrival timing of the lot. If the process bath is filled with chemical liquid, the lot is transferred to the process bath, and the wafer cleaning process is started.

As mentioned above, according to the embodiment of the present invention, new chemical liquid is not introduced to the process bath until the cleaning process is actually executed. Due to this, deterioration of the chemical liquid can be limited to a minimum. An arrival position of the lot, which serves as a trigger for introducing new chemical liquid, can be arbitrarily set if the position is an upper stream of the process bath where chemical liquid is replaced. For example, new chemical liquid can be introduced to the process bath at the time when a new lot reaches the loader 100 or a water cleaning bath 203($n$–1) or 204($n$–1) of a cleaning unit 201($n$–1) just before a process bath 202$n$. Also, the controller 260 to which the time required for replacing the chemical liquid is previously input may calculate a time at which a new wafer lot is transferred to a process bath and introduce new chemical liquid to the process bath when the calculated time equals to the input time.

According to the above-mentioned embodiment, there can be provided a function in which an operator can require a confirmation before new chemical liquid is introduced.

Figure 26:
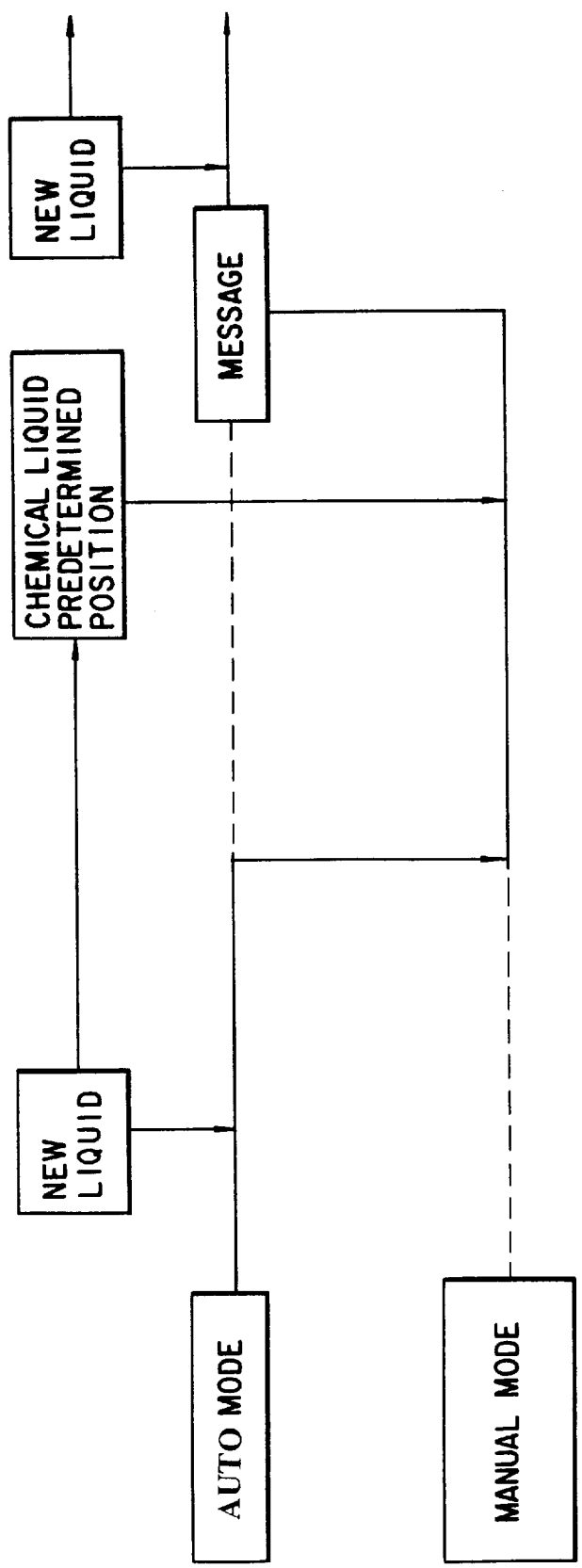
FIG. 26 is a view showing the relationship between a mode change of an auto-mode and a manual mode and chemical liquid replacement time.

More specifically, there is a case in which chemical liquid replacement time comes during the operation in the manual mode as shown in FIG. 26. In this case, the deteriorated chemical liquid cannot be automatically discharged in the auto mode (step S164 of FIG. 25). Due to this, there is possibility that the operator will miss the chemical liquid replacement time. However, in the embodiment of the present invention, even when chemical liquid replacement time comes in the manual mode operation, there can be used the structure of informing the operator of the arrival of the chemical liquid replacement time as a message. Or, there can be used the structure in which the operator is informed that the chemical liquid replacement time has already come when the mode is returned to the auto mode from the manual mode. Thereby, the operator can suitably replace chemical liquid with new chemical liquid without missing the chemical liquid replacement time in any case.

The above embodiment explained the cleaning machine in which cleaning units, each having one chemical liquid cleaning bath and two water cleaning baths, are combined each other. However, the present invention can be applied to the cleaning process in which various kinds of cleaning process baths are combined each other, e.g., combination of cleaning units, each having a plurality of chemical liquid cleaning baths and only one water cleaning bath.

As mentioned above, according to the present invention, auto take-out operation and/or auto chemical liquid/pure water replacement operation are executed if trouble occurs in the chemical liquid bath of the cleaning machine, for example, abnormality in connection with temperature, chemical liquid-level, exhaust system, circulation system, cover open/close mechanism, and leakage. Thereby, damage, which is exerted onto the processing lot, can be limited to a minimum.

Also, if abnormality is detected by the abnormality detection sensor, the transfer machine can automatically lift up the processing object from the chemical liquid bath where abnormality occurs. Thereby, the processing object can be moved to the water cleaning bath, which is positioned at the lower stream of the chemical liquid bath. In this way, the processing object is automatically moved to the safe water cleaning bath from the chemical liquid bath where abnormality occurs. Thereby, damage, which is exerted onto the processing wafer, can be restrained to a minimum. Moreover, the wafer is automatically transferred to the final cleaning bath, which is positioned at the lowest stream, through the water cleaning bath of each of the cleaning units, if necessary. Then, the wafer is dried in the dry process bath as required. Thereafter, the dried wafer can be transferred to the outside of the machine from the unloader.

Also, if abnormality is detected by the abnormality detection sensor, chemical liquid is discharged from the chemical liquid bath where abnormality occurs. Then, pure water is introduced to the chemical liquid bath to be circulated therein. Thereby, the processing object can be set to a safe state, so that damage, which is exerted onto the processing wafer, can be limited to a minimum. Therefore, the following process can be smoothly performed in such a state. This process is useful in the case when abnormality occurs in the circulation system of chemical liquid or the exhaust system. Or, this process is useful to the case when the processing object cannot be transferred to the outside of the chemical liquid bath due to abnormality generated in the cover open/close mechanism.

Furthermore, according to the present invention, the abnormal signal generated by the abnormal detection sensor is classified into the first-stage abnormal signal and the second-stage abnormal signal. The first-stage abnormal signal deviates from the normal range, and is placed in the first-stage abnormal range. The second-stage abnormal signal deviates from the first-stage abnormal range, and is placed in the second-stage abnormal range. For example, in the case of the first-stage abnormal signal, only the alarm is given. Only in the case of the second-stage abnormal signal, the abnormal condition process (process for measurement against abnormality) can be automatically executed. Or, the abnormal state process can be executed only in the case when abnormality is continued for a predetermined period of time on the basis of the continuation time of the abnormal signal. By these structures, there can be constructed the system, which can execute a suitable process in accordance with the degree of abnormality.

Moreover, according to the present invention, the processing object, which is positioned at the upper stream of the chemical liquid bath specified by the transfer machine, can jump over the chemical liquid bath. Thereby, the processing object can be directly transferred to a predetermined water cleaning bath, which is positioned at the lower stream of the chemical liquid bath, e.g., interface bath. Therefore, the following lot can jump over the preceding lot during the process of the preceding lot. Due to this, the following lot can be processed without waiting for the process of the preceding lot, thereby improving the throughput.

Furthermore, in specifying the cleaning unit by the dummy wafer, the dummy wafer can be sent to the plurality of cleaning units in the jump mode to detect in which chemical liquid bath trouble is generated. Therefore, the time which is needed to detect the trouble bath, can be largely reduced.

Also, the GCM (greatest common measure) number of kinds of cleaning units are arrayed to structure the cleaning machine, and the jump operation of the present invention is appropriately executed. Thereby, the plurality of kinds of cleaning processes can be executed by one cleaning machine. Therefore, a high degree of freedom in design can be obtained, and there is no need that the cleaning machine be assembled in accordance with the kinds of processes. Thereby, a cleaning system having a good cost/performance can be constructed.

Moreover, according to the present invention, even if there occurs the necessity of replacing deteriorated chemical liquid with new chemical liquid during the process of the wafer, the following operation can be executed.

More specifically, in a state that deteriorated chemical liquid is discharged or the process bath is cleaned, it is possible to wait for the introduction of new chemical liquid until the process of the next lot is actually executed. Thereby, the deterioration of chemical liquid, which is started at the time of the introduction of chemical liquid to the process bath, can be limited to a minimum. Also, the cost for chemical liquid can be reduced. Moreover, there is able to be limited to a minimum the occurrence of the following unfavorable states that the chemical liquid, which is still fully usable, is replaced with new chemical liquid, and the processing object is cleaned with the deteriorated chemical liquid.

Furthermore, in conventional operation, when chemical liquid replacement time comes during the operation in the manual mode, deteriorated chemical liquid cannot be automatically discharged in the auto mode. However, according to the present invention, since the operator can confirm whether or not chemical liquid is replaced with new chemical liquid even in the manual mode, the chemical liquid can be replaced with new chemical liquid without missing the replacement time. Moreover, even if it is difficult to conform whether or not replacement of chemical liquid is executed in the manual mode, the cleaning machine of the present invention is structured such that the operator can confirm whether or not chemical liquid is replaced with new chemical liquid at the time when the operation is returned to the auto mode from the manual mode. Therefore, chemical liquid can be surely replaced with new chemical liquid.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A cleaning machine comprising:

transferring means for transferring an object;

chemical liquid bath means having at least one chemical liquid bath containing chemical liquid in which the object is dipped for cleaning the object with the chemical liquid;

at least one cleaning unit following said chemical liquid bath and having at least one water cleaning bath containing pure water in which the object is dipped for cleaning the object with the pure water;

at least one transfer machine for transferring said object between said transferring means and said cleaning unit and transferring the object to the bath and taking out said object therefrom;

a plurality of sensors, provided in said chemical liquid bath and said cleaning units, for detecting a chemical liquid processing state and a cleaning state; and control means for taking countermeasures against abnormality in accordance with signals from said sensors.

2. The cleaning machine according to claim 1, wherein said sensors include a temperature sensor for detecting temperature of said chemical liquid to generate a first-stage abnormal signal when said temperature of chemical liquid deviates from a normal range and is placed in a first-stage abnormal range and generate a second-stage abnormal signal when said temperature of chemical liquid deviates from said first-stage abnormal range and is placed in a second-stage abnormal range, said control means controls said transfer machine in response to said second-stage abnormal signal for taking out the object from the chemical liquid and transferring the object to the water cleaning bath positioned at the lower stream of said chemical liquid bath by said transfer machines to dip the object in the pure water of the water cleaning bath.

3. The cleaning machine according to claim 1, wherein said sensors include an exhaust sensor, provided in an exhaust system, for generating an abnormal signal when an amount of exhaust is less than a predetermined range, and said control means controls said transfer machine for transferring the object to the water cleaning bath positioned at the lower stream of said chemical liquid bath by said transfer machines to dip the object in the pure water of the water cleaning bath when said abnormal signal is continued for more than a predetermined period of time.

4. The cleaning machine according to claim 1, wherein said chemical liquid bath means has a circulation means for circulating chemical liquid of said chemical bath, said plurality of sensors includes a circulation system sensor, provided in said circulation means, for detecting a circulation state of chemical liquid, and said control means controls said transfer machine for taking out the object from the chemical bath in response to a signal showing an abnormal state of the circulation system sent from said circulation system sensor and for transferring the object to the water cleaning bath positioned at the lower stream of the chemical liquid bath to dip the object in the pure water of the water cleaning bath.

5. The cleaning machine according to claim 1, further comprising discharge/supply means for discharging chemical liquid from said chemical liquid bath and supplying pure water thereto, wherein said chemical liquid bath has an openable/closable cover, said sensors include an open/close sensor for detecting an opening/closing state of said cover, and said control means controls said discharge/supply means to discharge chemical liquid from said chemical bath and supply pure water to said waste liquid/pure water supplying means in response to a detection signal of said open/close sensor when said open/close sensor detects abnormality of the opening/closing state of said cover.

6. The cleaning machine according to claim 1, further comprising discharge/supply means for discharging chemical liquid from said chemical liquid bath so as to supply pure water thereto, wherein said sensors include a temperature sensor for detecting temperature of said chemical liquid so as to generate a first-stage abnormal signal when said temperature of chemical liquid deviates from a normal range and is placed in a first-stage abnormal range and generate a second-stage abnormal signal when said temperature of chemical liquid deviates from said first-stage abnormal range and is placed in a second-stage abnormal range, said control means controls said discharge/supply means to discharge chemical liquid from said chemical bath and supply pure water to said waste liquid/pure water supplying means in response to the second-stage abnormal signal.

7. The cleaning machine according to claim 1, further comprising discharge/supply means for discharging chemical liquid from said chemical liquid bath and supplying pure water thereto, wherein said sensors include an exhaust sensor, provided in an exhaust system, for generating an abnormal signal when an amount of exhaust is less than a predetermined range, and said control means controls said discharge/supply means to discharge chemical liquid from said chemical liquid bath and supply pure water as means for taking countermeasures against abnormality when said abnormal signal continues for more than a predetermined period of time.

8. The cleaning machine according to claim 1, further comprising discharge/supply means for discharging chemical liquid from said chemical liquid bath and supplying pure water thereto and a circulation loop for circulating chemical liquid of said chemical liquid bath, wherein said sensors are provided in said circulation loop, and include a circulation system sensor for detecting a circulation state of chemical liquid, and said control means controls said discharge/supply means to discharge chemical liquid from said chemical liquid bath and supply pure water as means for taking countermeasures against abnormality in response to a signal showing an abnormal state of the circulation system sent from said circulation system sensor.

9. A cleaning machine comprising:

transferring section for transferring an object;

at least one chemical liquid bath containing chemical liquid in which the object is dipped for cleaning the object with the chemical liquid;

a plurality of cleaning units each having at least one water cleaning bath containing pure water in which the object is dipped for cleaning the object with the pure water;

a plurality of transfer machines for transferring said object between said transferring section and said cleaning unit adjacent to said transferring section, and between said adjacent cleaning units, and transferring the object in the bath and taking out the object therefrom;

a plurality of sensors, provided in said chemical liquid bath and said cleaning units, for detecting a chemical liquid processing state and a cleaning state; and control means for taking countermeasures against abnormality in response to each of signals from said plurality of sensors.

* * * * *